US012349396B2

(12) United States Patent
Huang

(10) Patent No.: US 12,349,396 B2
(45) Date of Patent: Jul. 1, 2025

(54) SEMICONDUCTOR DEVICE WITH SHALLOW CONTACTS AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 479 days.

(21) Appl. No.: 17/897,898

(22) Filed: Aug. 29, 2022

(65) Prior Publication Data

US 2024/0072165 A1 Feb. 29, 2024

(51) Int. Cl.
*H10D 30/63* (2025.01)
*H01L 23/522* (2006.01)
*H10D 64/01* (2025.01)
*H10D 64/23* (2025.01)
*H10D 64/27* (2025.01)

(52) U.S. Cl.
CPC ......... *H10D 30/63* (2025.01); *H01L 23/5226* (2013.01); *H10D 64/01* (2025.01); *H10D 64/252* (2025.01); *H10D 64/513* (2025.01)

(58) Field of Classification Search
CPC ...... H10D 30/63; H10D 64/252; H10D 64/01; H10D 64/513; H01L 23/5226
USPC .......................................................... 257/330
See application file for complete search history.

(56) References Cited

U.S. PATENT DOCUMENTS

| 9,379,042 B2 * | 6/2016 | Park ................... H10B 12/485 |
| 2012/0314469 A1 | 12/2012 | Shuto |
| 2013/0292759 A1 | 11/2013 | Mathew et al. |
| 2016/0093717 A1 | 3/2016 | Oh |
| 2017/0033102 A1 | 2/2017 | Kim et al. |

FOREIGN PATENT DOCUMENTS

| CN | 111640748 A | 9/2020 |
| TW | 200939458 A | 9/2009 |
| TW | I546898 B | 8/2016 |
| TW | 201917870 A | 5/2019 |
| TW | 202232736 A | 8/2022 |

* cited by examiner

*Primary Examiner* — Tu-Tu V Ho
(74) *Attorney, Agent, or Firm* — MUNCY, GEISSLER, OLDS & LOWE, P.C.

(57) ABSTRACT

The present application discloses a semiconductor device and a method for fabricating the semiconductor device. The semiconductor device includes a substrate; a word line structure positioned in the substrate; a plurality of impurity regions positioned in the substrate and adjacent to the word line structure; a plurality of bottom shallow contacts positioned on the word line structure; a first interconnect layer positioned on the plurality of bottom shallow contacts; a plurality of top shallow contacts positioned on the first interconnect layer; and a plurality of deep contacts positioned on the plurality of impurity regions. Top surfaces of the plurality of top shallow contacts and top surfaces of the plurality of deep contacts are substantially coplanar.

20 Claims, 27 Drawing Sheets

SEMICONDUCTOR DEVICE WITH SHALLOW CONTACTS AND METHOD FOR FABRICATING THE SAME

TECHNICAL FIELD

The present disclosure relates to a semiconductor device and a method for fabricating the semiconductor device, and more particularly, to a semiconductor device with shallow contacts and a method for fabricating the semiconductor device with the shallow contacts.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a word line structure positioned in the substrate; a plurality of impurity regions positioned in the substrate and adjacent to the word line structure; a plurality of bottom shallow contacts positioned on the word line structure; a first interconnect layer positioned on the plurality of bottom shallow contacts; a plurality of top shallow contacts positioned on the first interconnect layer; and a plurality of deep contacts positioned on the plurality of impurity regions. Top surfaces of the plurality of top shallow contacts and top surfaces of the plurality of deep contacts are substantially coplanar.

Another aspect of the present disclosure provides a semiconductor device including a substrate; a plurality of isolation layers positioned in the substrate; a word line structure positioned in the substrate and between the plurality of isolation layers; a plurality of impurity regions positioned in the substrate and adjacent to the word line structure; a plurality of bottom shallow contacts positioned on the word line structure; a first interconnect layer positioned on the plurality of bottom shallow contacts; a plurality of top shallow contacts positioned on the first interconnect layer; and a plurality of deep contacts positioned on the plurality of impurity regions. Top surfaces of the plurality of top shallow contacts and top surfaces of the plurality of deep contacts are substantially coplanar. The word line structure extends along a first direction in a top-view perspective. The plurality of isolation layers extend along the first direction and are parallel to each other.

Another aspect of the present disclosure provides a method for fabricating a semiconductor device including providing a substrate; forming a word line structure in the substrate and forming a plurality of impurity regions in the substrate and adjacent to the word line structure; forming a plurality of bottom shallow contacts on the word line structure; forming a first interconnect layer on the plurality of bottom shallow contacts; forming a plurality of top shallow contacts on the first interconnect layer; and forming a plurality of deep contacts on the plurality of impurity regions. Top surfaces of the plurality of top shallow contacts and top surfaces of the plurality of deep contacts are substantially coplanar. Widths of the plurality of bottom shallow contacts are less than widths of the plurality of deep contacts.

Due to the design of the semiconductor device of the present disclosure, the aspect ratio of the plurality of bottom shallow contacts and the plurality of bottom shallow contacts may be reduced by employing the first interconnect layer between the plurality of bottom shallow contacts and the plurality of top shallow contacts. As a result, the complexity of fabricating the semiconductor device may be reduced.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying FIGURES. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
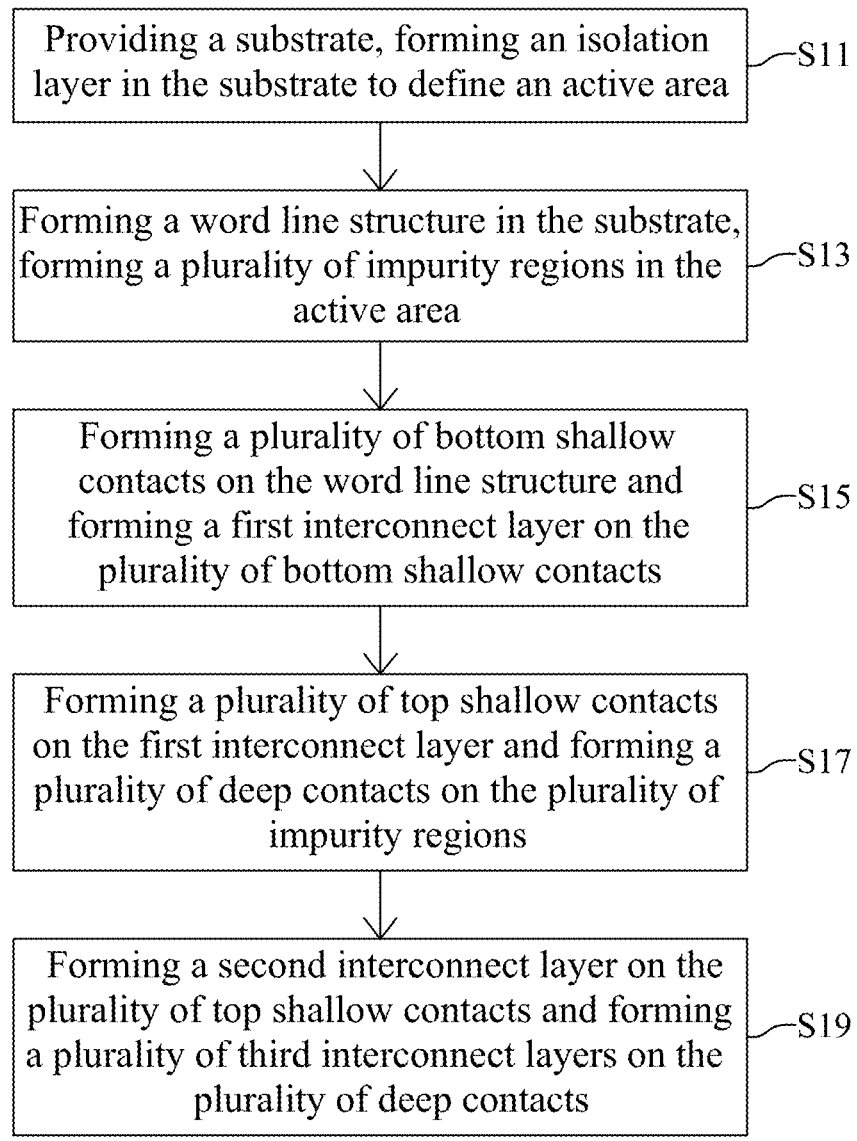
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the FIGURES. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
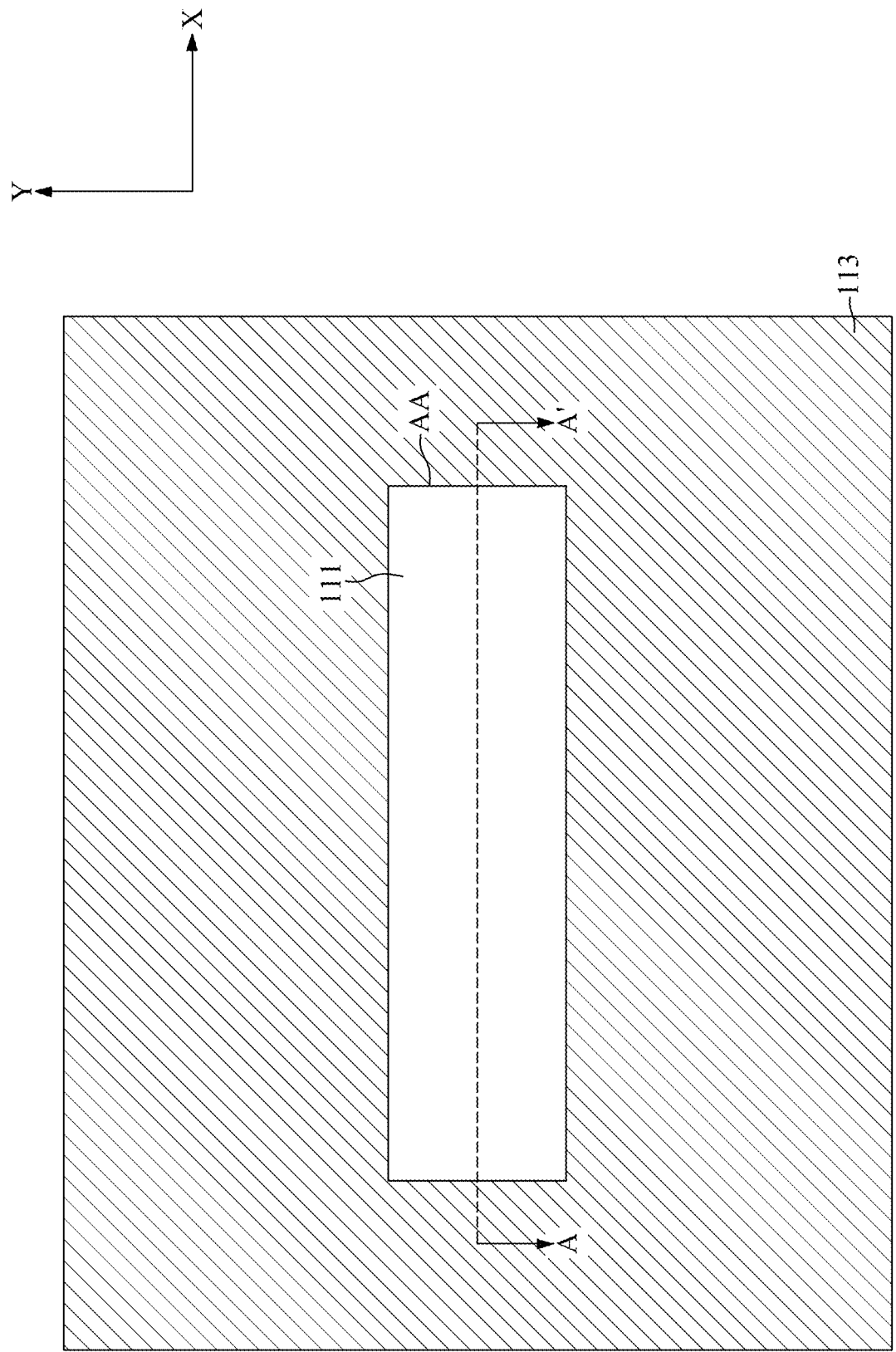
FIG. 2 illustrates, in a schematic top-view diagram, an intermediate semiconductor device in accordance with one embodiment of the present disclosure.
Figure 3:
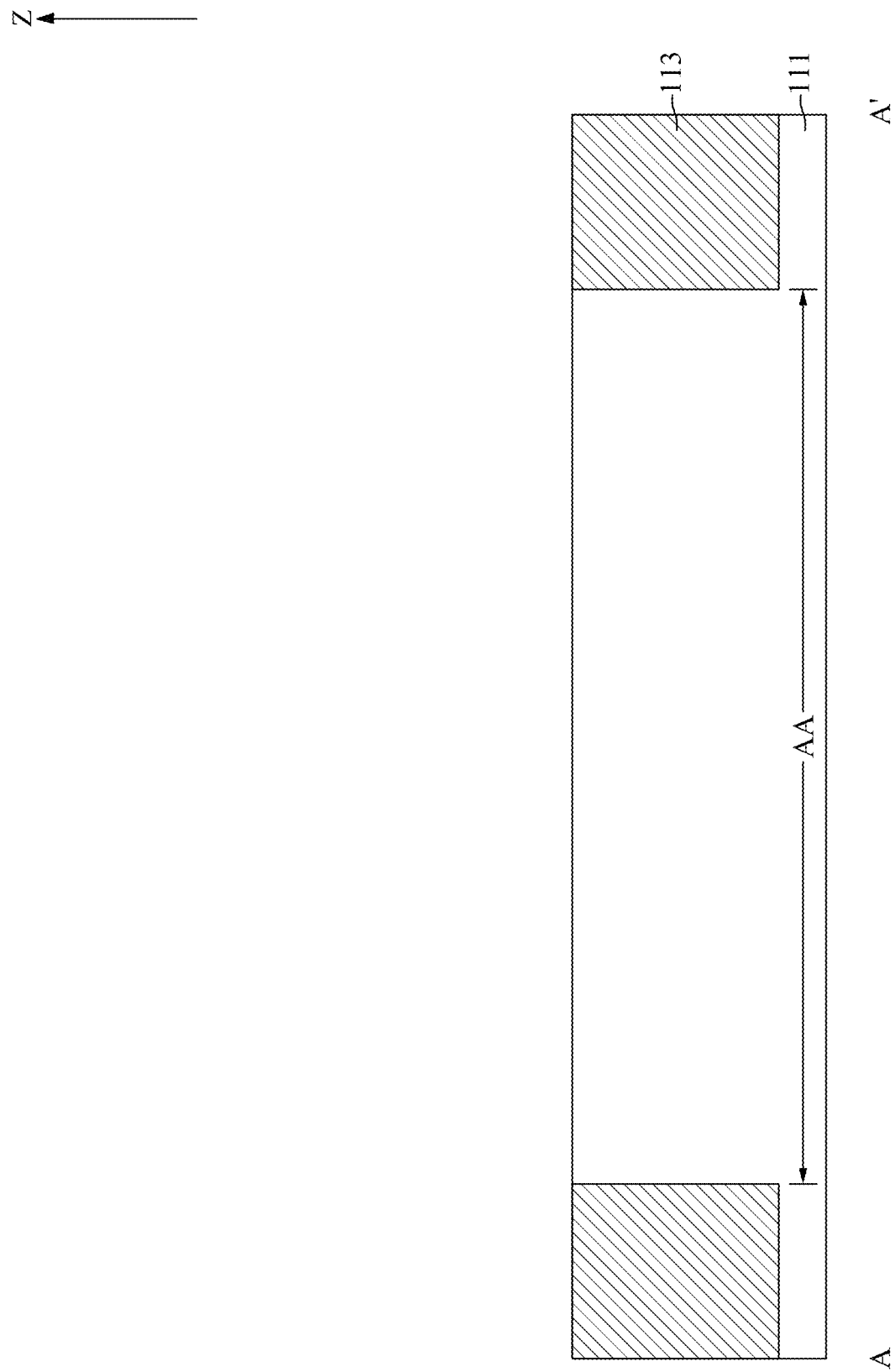
FIG. 3 is a schematic cross-sectional view diagram taken along a line A-A' in FIG. 2 illustrating part of a flow for fabricating the semiconductor device in accordance with one embodiment of the present disclosure.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along a line A-A' in FIG. 2 illustrating part of a flow for fabricating the semiconductor device 1A in accordance with one embodiment of the present disclosure.

It should be noted that some elements of the semiconductor device 1A of the schematic top-view diagrams may be omitted for clarity.

With reference to FIGS. 1 to 3, at step S11, a substrate 111 may be provided, an isolation layer 113 may be formed in the substrate 111 to define an active area AA.

With reference to FIGS. 2 and 3, in some embodiments, the substrate 111 may be a bulk semiconductor substrate that is composed entirely of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 111 may include a semiconductor-on-insulator structure which consists of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIGS. 2 and 3, the isolation layer 113 may be formed in the substrate 111. A series of deposition processes may be performed to deposit a pad oxide layer (not shown) and a pad nitride layer (not shown) on the substrate 111. A photolithography process may be performed to define the position of the isolation layer 113. After the photolithography process, an etch process, such as an anisotropic dry etch process, may be performed to form trenches (not shown) penetrating through the pad oxide layer, the pad nitride layer, and extending to the substrate 111. An insulating material may be deposited into the trenches and a planarization process, such as chemical mechanical polishing, may be subsequently performed to remove excess filling material until the top surface of the substrate 111 is exposed so as to form the isolation layer 113. The top surface of the isolation layer 113 and the top surface of the substrate 111 may be substantially coplanar. The portion of the substrate 111 surrounded by the isolation layer 113 may be referred to as the active area AA.

It should be noted that the active area AA may comprise a portion of the substrate 111 and a space above the portion of the active area AA. Describing an element as being disposed on the active area AA means that the element is disposed on a top surface of the portion of the substrate 111. Describing an element as being disposed in the active area AA means that the element is disposed in the portion of the substrate 111; however, a top surface of the element may be even with the top surface of the portion of the substrate 111. Describing an element as being disposed above the active area AA means that the element is disposed above the top surface of the portion of the substrate 111.

Figure 4:
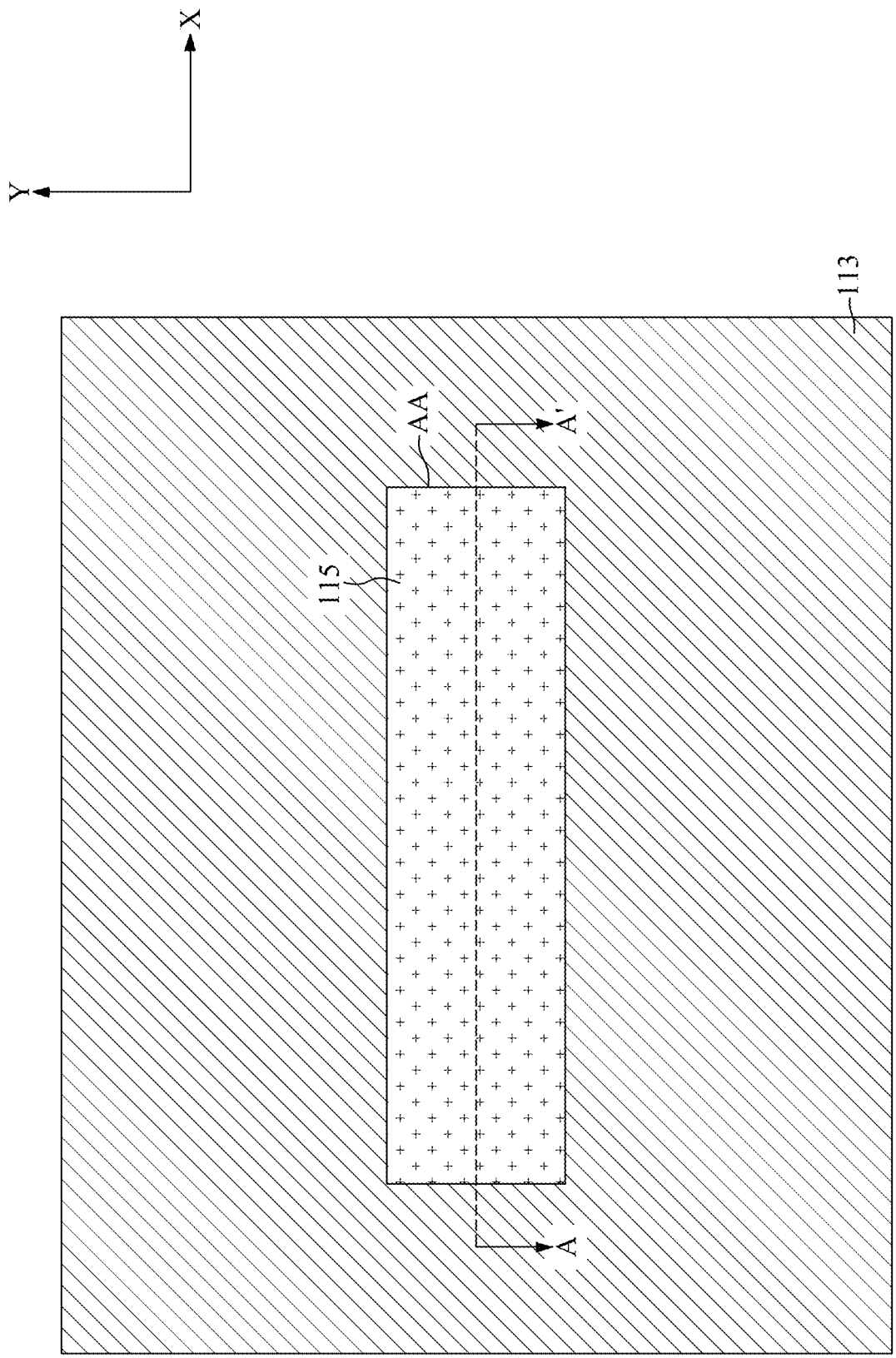
FIG. 4 illustrates, in a schematic top-view diagram, an intermediate semiconductor device in accordance with one embodiment of the present disclosure.
Figure 5:
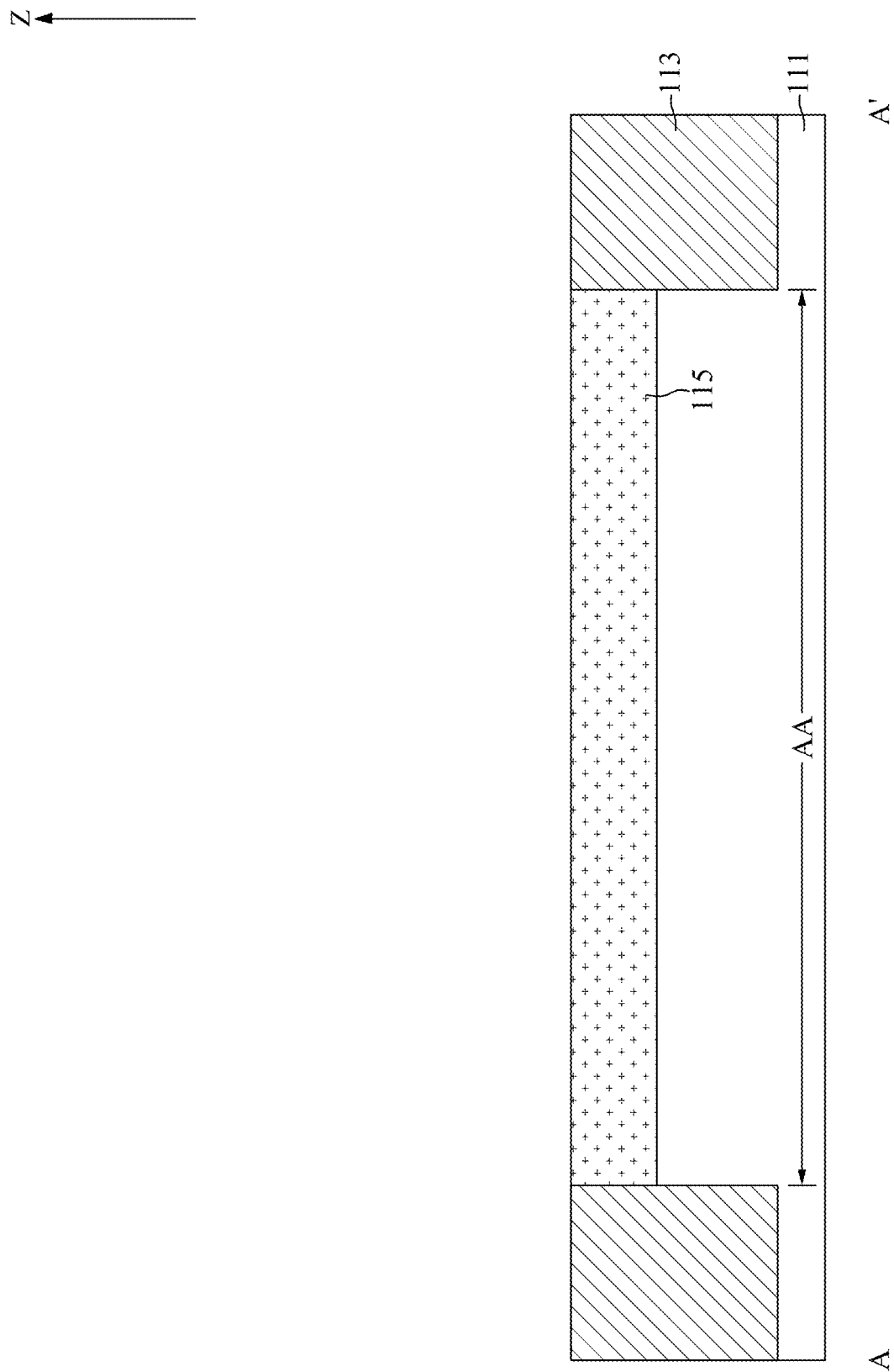
FIG. 5 is a schematic cross-sectional view diagram taken along a line A-A' in FIG. 4 illustrating part of the flow for fabricating the semiconductor device in accordance with one embodiment of the present disclosure.

FIG. 4 illustrates, in a schematic top-view diagram, an intermediate semiconductor device in accordance with one embodiment of the present disclosure. FIG. 5 is a schematic cross-sectional view diagram taken along a line A-A' in FIG. 4 illustrating part of the flow for fabricating the semiconductor device 1A in accordance with one embodiment of the present disclosure.

With reference to FIG. 1 and FIGS. 4 to 9, at step S13, a word line structure 310 may be formed in the substrate 111, a plurality of impurity regions 115 may be formed in the active area AA.

With reference to FIGS. 4 and 5, an impurity region 115 may be formed in the active area AA of the substrate 111. The impurity region 115 may be formed by an implantation process. The implantation process may add p-type impurities (dopants) or n-type impurities (dopants) to the substrate 111 to form the impurity region 115 having an electrical type. The implantation process including p-type impurities may add impurities to an intrinsic semiconductor that creates deficiencies of valence electrons. In a silicon-containing substrate, examples of p-type dopants, i.e., impurities include but are not limited to boron, aluminum, gallium, or indium. The implantation process including n-type impurities may contribute free electrons to the intrinsic semiconductor. In a silicon-containing substrate, examples of n-type dopants, i.e., impurities, include but are not limited to antimony, arsenic, and phosphorous. It should be noted that the term "electrical type" denotes a dopant region being p-type or n-type. In the present embodiment, the impurity region 115 may be formed by the implantation process including n-type impurities and may have a first electrical type (e.g., the n-type.)

In some embodiments, the dopant concentration of the impurity region 115 may be between about 1E19 atoms/cm^3 and about 1E21 atoms/cm^3.

In some embodiments, an anneal process may be performed to activate the impurity region 115. The temperature of the anneal process may be between about 800° C. and about 1250° C. The anneal process may have a process duration between about 1 millisecond and about 500 milliseconds. The anneal process may be, for example, a rapid thermal anneal, a laser spike anneal, or a flash lamp anneal.

Figure 6:
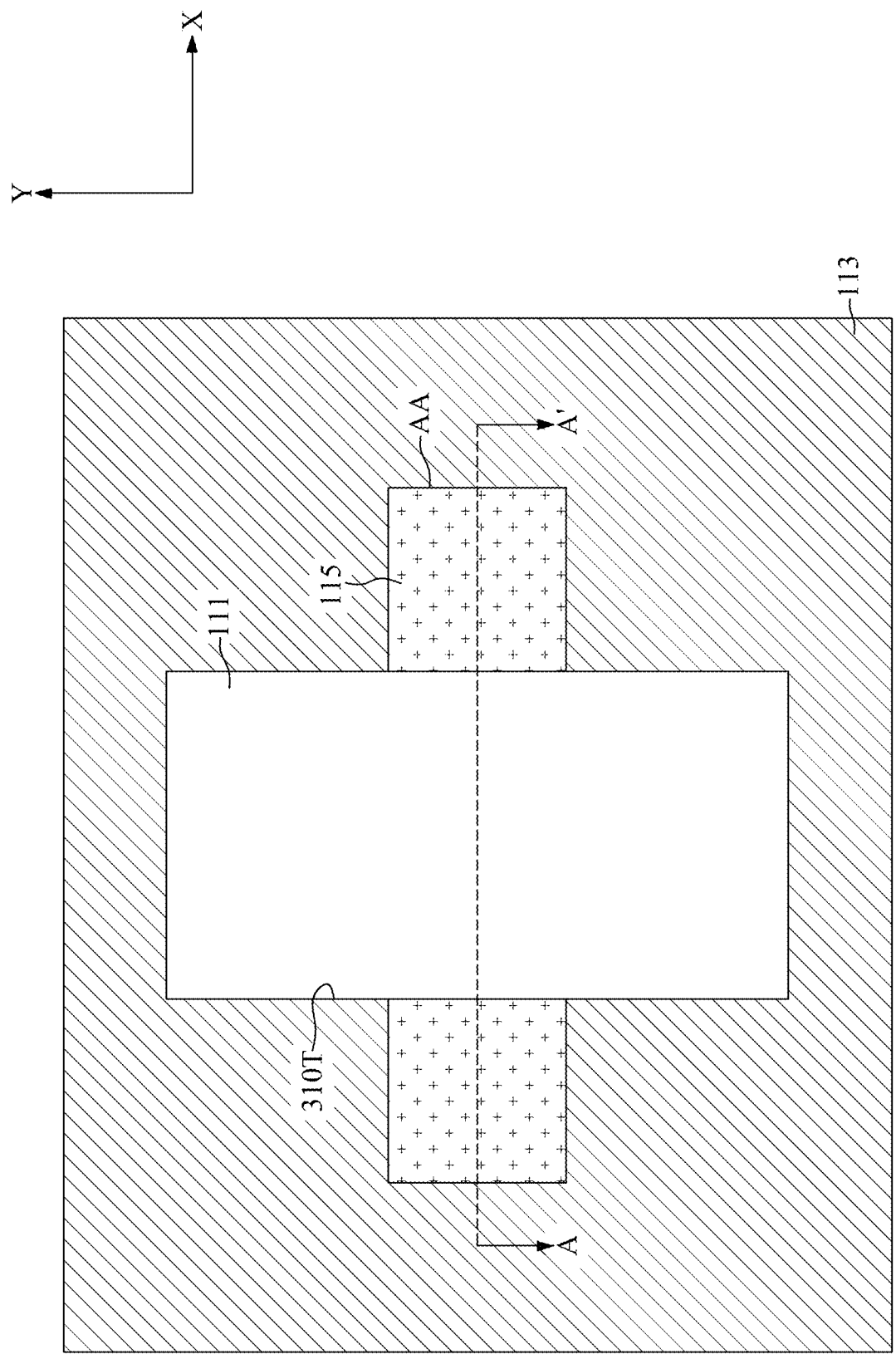
FIG. 6 illustrates, in a schematic top-view diagram, an intermediate semiconductor device in accordance with one embodiment of the present disclosure.
Figure 7:
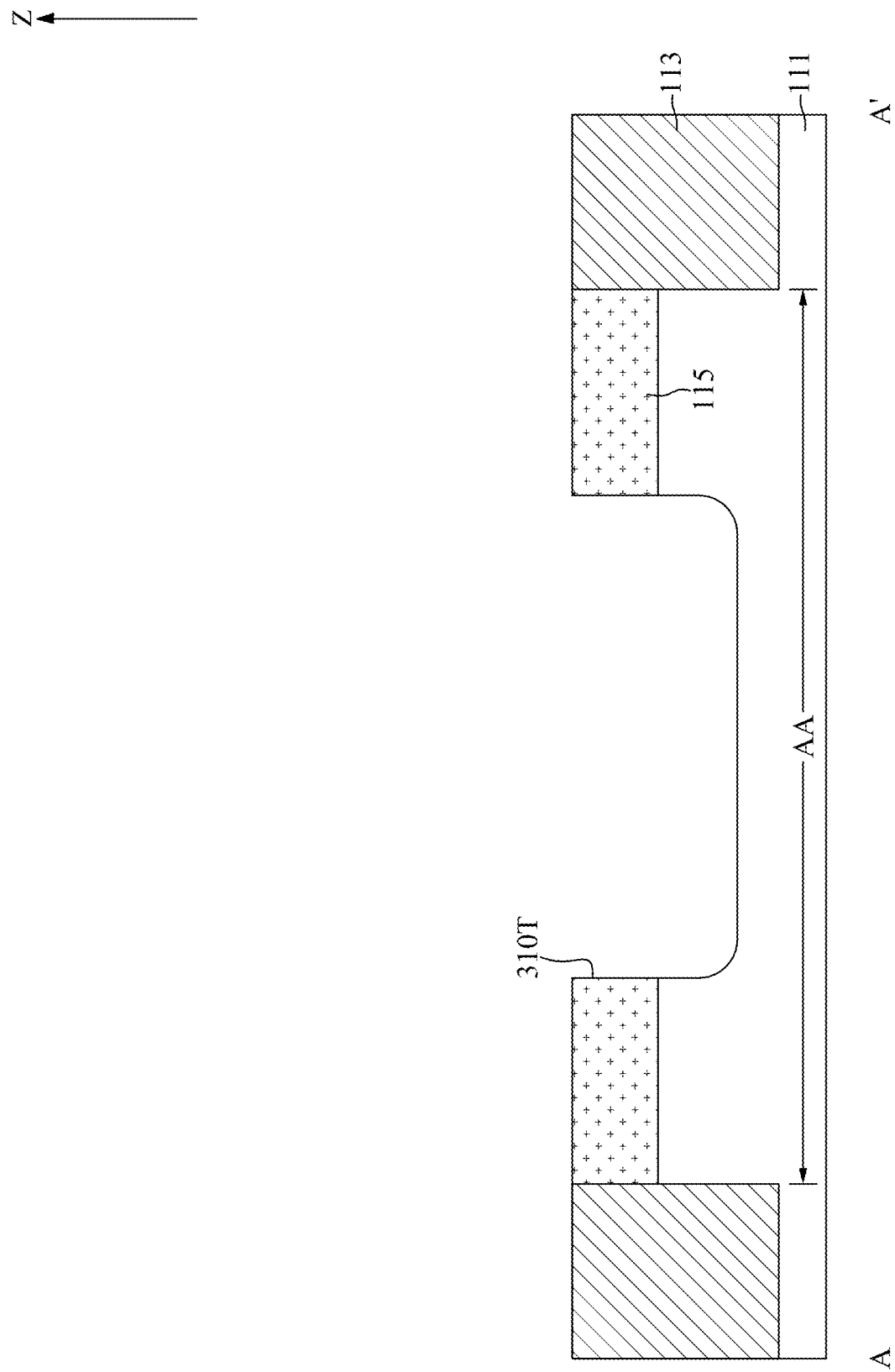
FIG. 7 is a schematic cross-sectional view diagram taken along a line A-A' in FIG. 6 illustrating part of the flow for fabricating the semiconductor device in accordance with one embodiment of the present disclosure.
Figure 8:
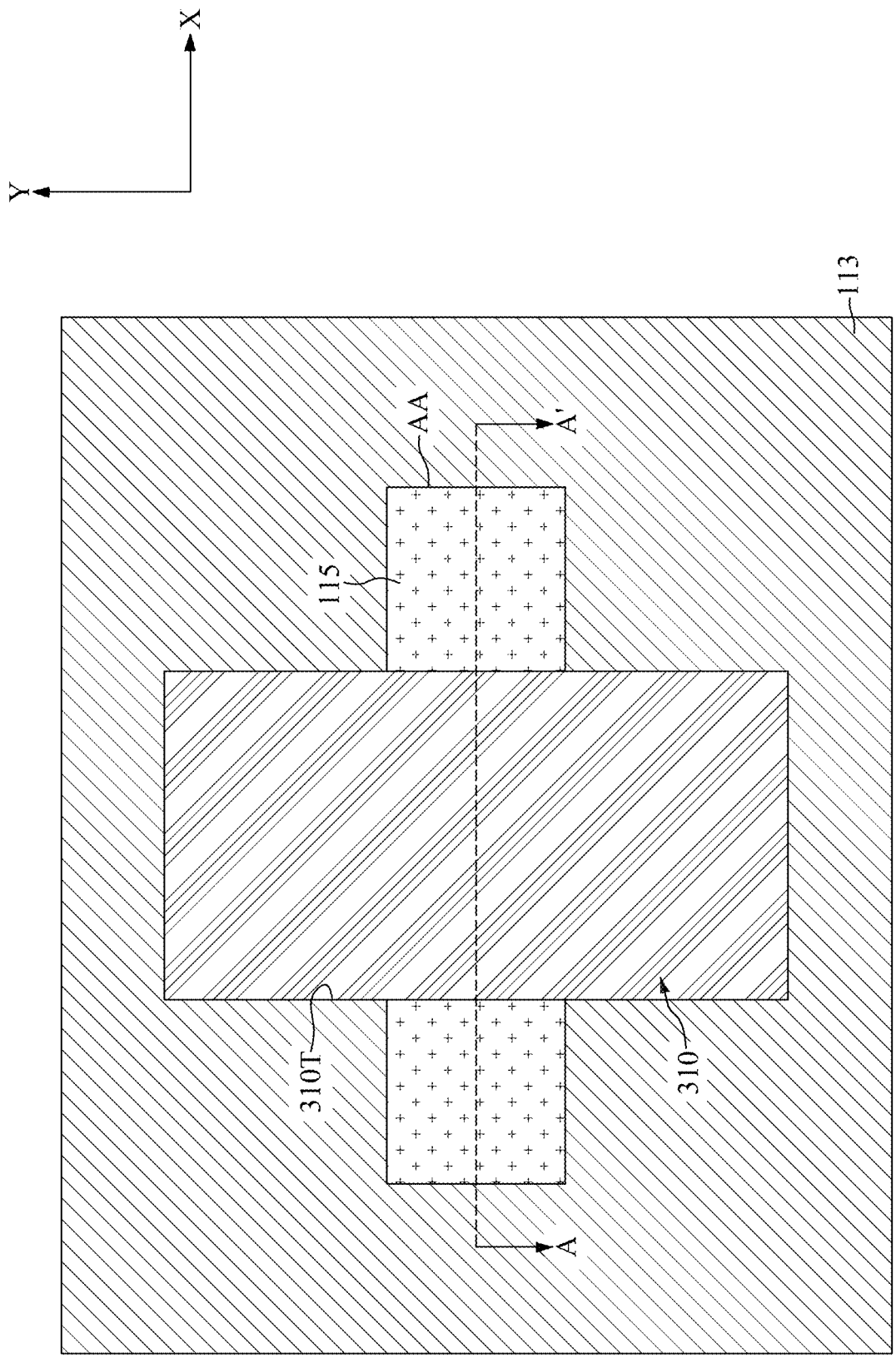
FIG. 8 illustrates, in a schematic top-view diagram, an intermediate semiconductor device in accordance with one embodiment of the present disclosure.
Figure 9:
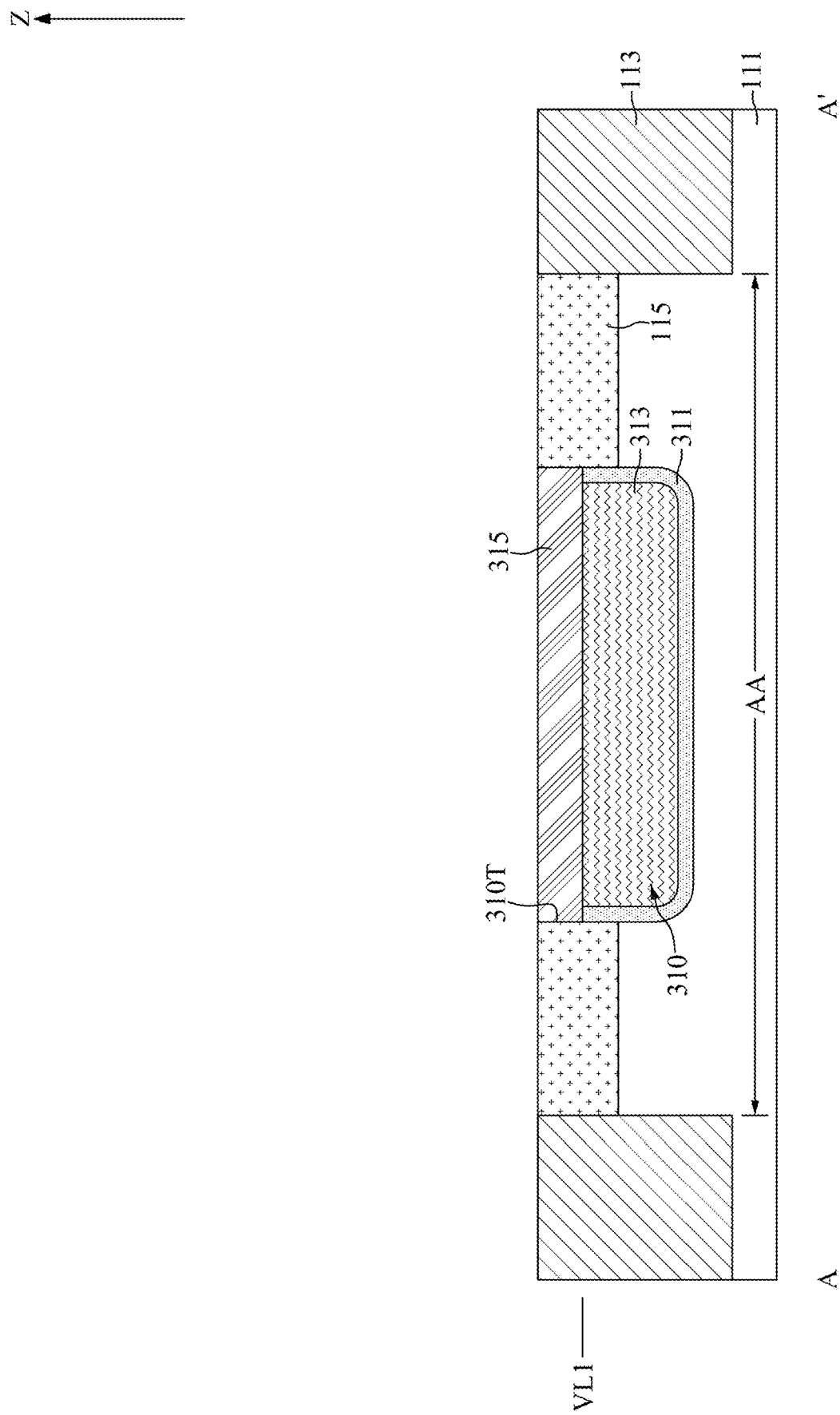
FIG. 9 is a schematic cross-sectional view diagram taken along a line A-A' in FIG. 8 illustrating part of the flow for fabricating the semiconductor device in accordance with one embodiment of the present disclosure.

FIG. 6 illustrates, in a schematic top-view diagram, an intermediate semiconductor device in accordance with one embodiment of the present disclosure. FIG. 7 is a schematic cross-sectional view diagram taken along a line A-A' in FIG. 6 illustrating part of the flow for fabricating the semiconductor device 1A in accordance with one embodiment of the present disclosure. FIG. 8 illustrates, in a schematic top-view diagram, an intermediate semiconductor device in accordance with one embodiment of the present disclosure. FIG. 9 is a schematic cross-sectional view diagram taken along a line A-A' in FIG. 8 illustrating part of the flow for fabricating the semiconductor device 1A in accordance with one embodiment of the present disclosure.

With reference to FIGS. 6 and 7, a word line trench 310T may be formed in the substrate 111. The word line trench 310T may be formed by a photolithography process and a following etch process. In some embodiments, the word line trench 310T may have a line shape and may extend along the direction Y and traverse the impurity region 115 in a top-view perspective. The impurity region 115 may be divided into two separated parts by the word line trench 310T.

With reference to FIGS. 8 and 9, the word line structure 310 may be formed in the word line trench 310T. In some embodiments, the word line structure 310 may include a word line insulating layer 311, a word line conductive layer 313, and a word line capping layer 315.

With reference to FIGS. 8 and 9, the word line insulating layer 311 may be conformally formed on the surface of the word line trench 310T. The word line insulating layer 311 may have a U-shaped cross-sectional profile. In other words, the word line insulating layer 311 may be inwardly formed in the substrate 111. In some embodiments, the word line insulating layer 311 may be formed by a thermal oxidation process. For example, the word line insulating layer 311 may be formed by oxidizing the surface of the word line trench 310T. In some embodiments, the word line insulating layer 311 may be formed by a deposition process such as a chemical vapor deposition or an atomic layer deposition. The word line insulating layer 311 may include a high-k material, an oxide, a nitride, an oxynitride or combinations thereof. In some embodiments, after a liner polysilicon layer (not shown for clarity) is deposited, the word line insulating layer 311 may be formed by radical-oxidizing the liner polysilicon layer. In some embodiments, after a liner silicon nitride layer (not shown for clarity) is formed, the word line insulating layer 311 may be formed by radical-oxidizing the liner silicon nitride layer.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof. Other high-k materials may be selectively used for the high-k material.

With reference to FIGS. 8 and 9, the word line conductive layer 313 may be formed on the word line insulating layer 311. In some embodiments, in order to form the word line conductive layer 313, a conductive layer (not shown for clarity) may be formed to fill the word line trench 310T, and a recessing process may be subsequently performed. The recessing process may be performed as an etch-back process or sequentially performed as the planarization process and an etch-back process. The word line conductive layer 313 may have a recessed shape that partially fills the word line trench 310T. That is, the top surface of the word line conductive layer 313 may be at a vertical level VL1 lower than the top surface of the substrate 111.

In some embodiments, the word line conductive layer 313 may include a metal, a metal nitride, or a combination thereof. For example, the word line conductive layer 313 may be formed of titanium nitride, tungsten, or a titanium nitride/tungsten. After the titanium nitride is conformally formed, the titanium nitride/tungsten may have a structure where the word line trench 310T is partially filled using tungsten. The titanium nitride or the tungsten may be solely used for the word line conductive layer 313.

In some embodiments, the word line conductive layer 313 may be formed of, for example, a conductive material such as polycrystalline silicon, polycrystalline silicon germanium, or a combination thereof. In some embodiments, the word line conductive layer 313 may be doped with a dopant such as phosphorus, arsenic, antimony, or boron. In some embodiments, the word line conductive layer 313 may be formed of, for example, tungsten, aluminum, titanium, copper, the like, or a combination thereof.

With reference to FIGS. 8 and 9, a dielectric material (not shown) may be deposited by, for example chemical vapor deposition, to completely fill the word line trench 310T and covering the top surface of the substrate 111. A planarization process, such as chemical mechanical polishing, may be performed until the top surface of the substrate 111 is exposed to provide a substantially flat surface for subsequent processing steps and form the word line capping layer 315. In some embodiments, the word line capping layer 315 may be formed of, for example, silicon oxide, silicon nitride, silicon oxynitride, silicon nitride oxide, or other applicable dielectric material.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 8 and 9, the shape and the profile of the word line structure 310 may be determined by the shape and the profile of the word line trench 310T. In other words, the word line structure 310 may have a line shape and may extend along the direction Y.

Figure 10:
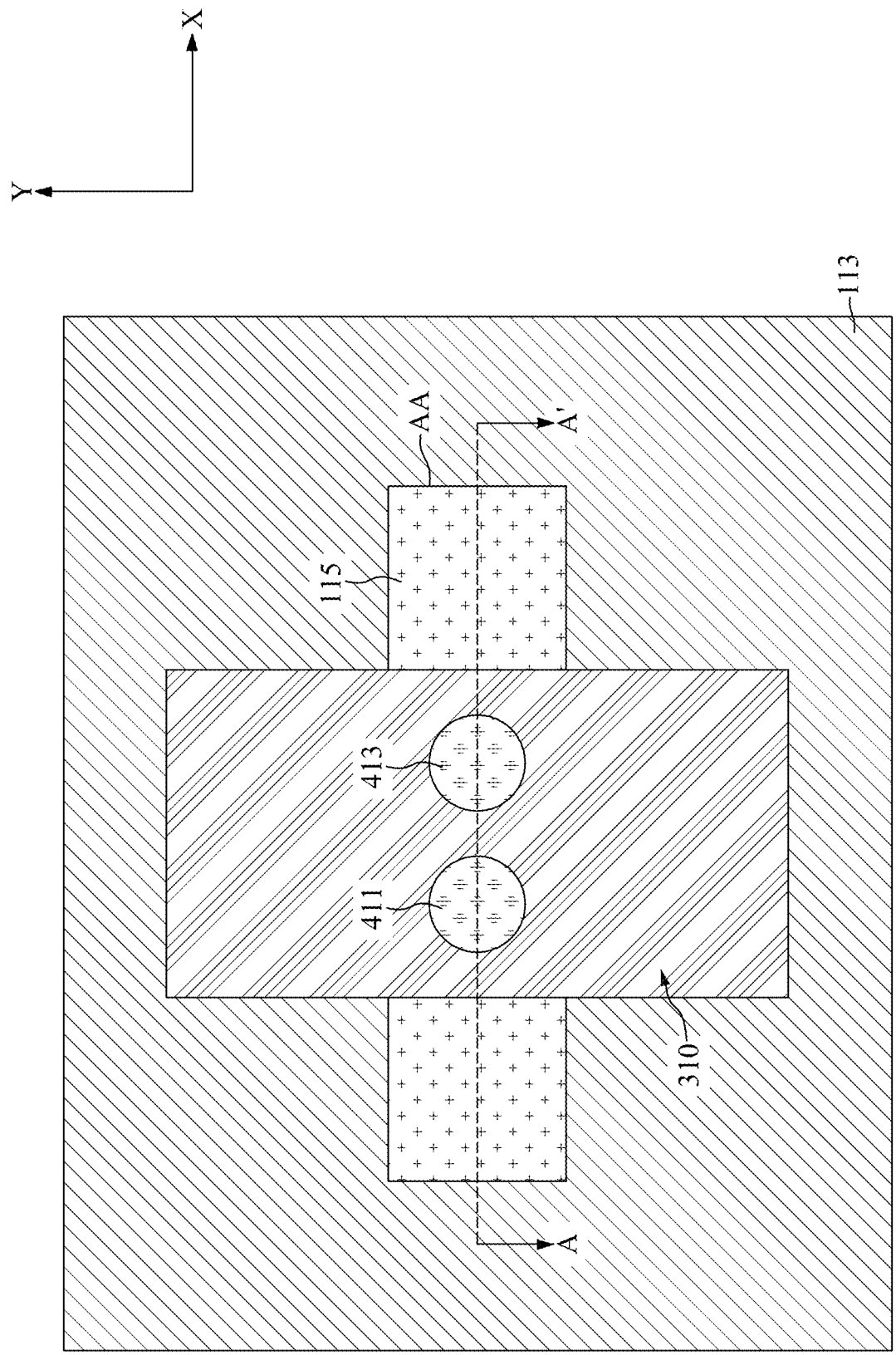
FIG. 10 illustrates, in a schematic top-view diagram, an intermediate semiconductor device in accordance with one embodiment of the present disclosure.
Figure 11:
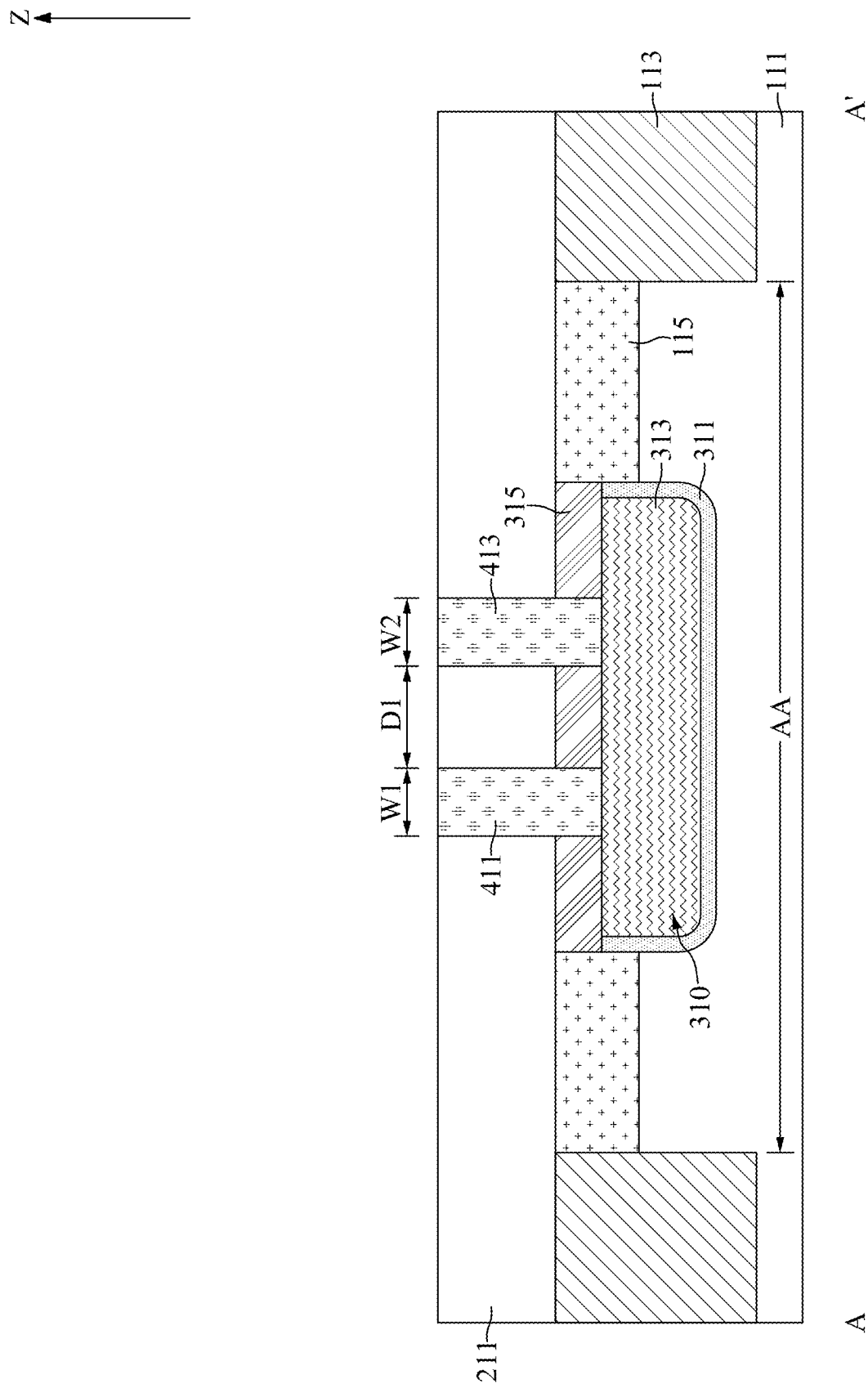
FIGS. 11 and 12 are schematic cross-sectional view diagrams taken along a line A-A' in FIG. 10 illustrating part of the flow for fabricating the semiconductor device in accordance with one embodiment of the present disclosure.
Figure 12:
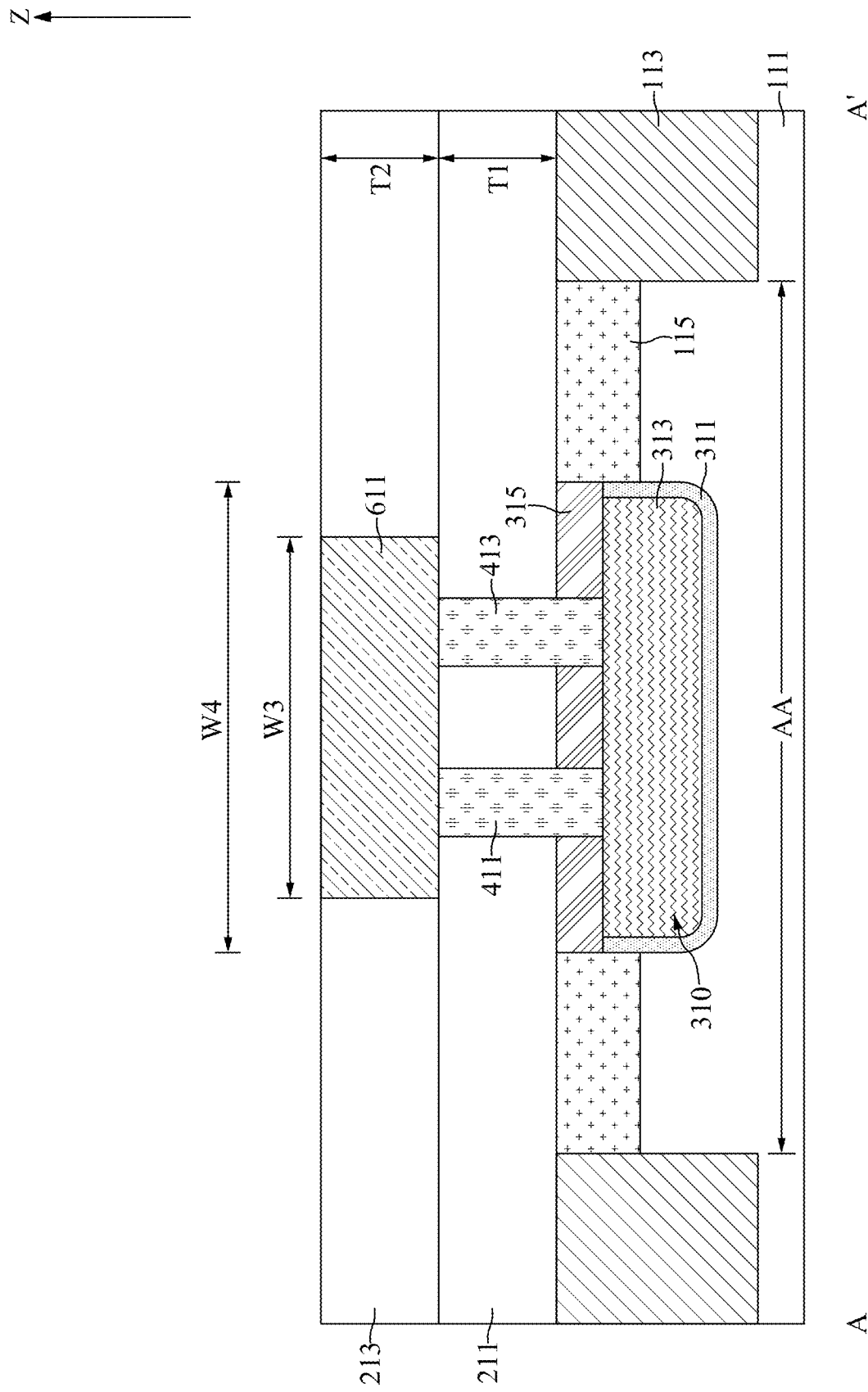

FIG. 10 illustrates, in a schematic top-view diagram, an intermediate semiconductor device in accordance with one embodiment of the present disclosure. FIGS. 11 and 12 are schematic cross-sectional view diagrams taken along a line A-A' in FIG. 10 illustrating part of the flow for fabricating the semiconductor device 1A in accordance with one embodiment of the present disclosure.

With reference to FIG. 1 and FIGS. 10 to 12, at step S15, a plurality of bottom shallow contacts 411, 413 may be formed on the word line structure 310 and a first interconnect layer 611 may be formed on the plurality of bottom shallow contacts 411, 413.

With reference to FIGS. 10 and 11, a bottom dielectric layer 211 may be formed on the substrate 111. In some embodiments, the bottom dielectric layer 211 may be formed of, for example, silicon oxide, borophosphosilicate glass, undoped silicate glass, fluorinated silicate glass, the like, or a combination thereof. In some embodiments, the undoped silicate glass can be expressed as formula $SiO_x$. The x may be between 1.4 and 2.1. In some embodiments, the bottom dielectric layer 211 may be formed by a deposition process such as chemical vapor deposition, plasma enhanced chemical vapor deposition, or other applicable deposition process.

In some embodiments, a planarization process, such as chemical mechanical polishing, may be performed to remove excess material and provide a substantially flat surface for subsequent processing steps.

In some embodiments, the bottom dielectric layer 211 may include, for example, silicon dioxide, undoped silicate glass, fluorosilicate glass, borophosphosilicate glass, a spin-on low-k dielectric layer, a chemical vapor deposition low-k dielectric layer, or a combination thereof. The term "low-k" as used throughout the present application denotes a dielectric material that has a dielectric constant of less than silicon dioxide. In some embodiments, the bottom dielectric layer 211 may include a self-planarizing material such as a spin-on glass or a spin-on low-k dielectric material such as SiLK™ The use of a self-planarizing dielectric material may avoid the need to perform a subsequent planarizing step. In some embodiments, the bottom dielectric layer 211 may be formed by a deposition process including, for example, chemical vapor deposition, plasma enhanced chemical vapor deposition, spin-on coating, or other applicable deposition process.

With reference to FIGS. 10 and 11, a plurality of contact openings (not shown) may be formed along the bottom dielectric layer 211 and the word line capping layer 315 to expose portions of the word line conductive layer 313. The plurality of contact openings may be formed by a first opening etch process. Subsequently, a first deposition process may be performed to fill the plurality of contact openings. A planarization process, such as chemical mechanical polishing, may be performed until the top surface of the bottom dielectric layer 211 to remove excess material, provide a substantially flat surface for subsequent processing steps, and form the plurality of bottom shallow contacts 411, 413.

In some embodiments, the first opening etch process may be conducted in any suitable plasma processing apparatus, for example, a reactive ion etching apparatus. The reactive ion etching apparatus may contain an anode and cathode within a vacuum chamber. The cathode is typically in the form of a pedestal for supporting a semiconductor wafer within the chamber, while the anode is typically formed of the walls and top of the chamber. To process a wafer, a plasma source gas is pumped into the vacuum chamber and the anode and cathode are driven by a single sinusoidal frequency source to excite the plasma source gas into a plasma. The single frequency is typically 13.56 MHz, although frequencies from 100 kHz to 2.45 GHz are often used, with the occasional use of other frequencies. The RF power excites the plasma source gas, producing a plasma within the chamber proximate to the semiconductor wafer being processed. The etching chemistry used in the first opening etch process by the reactive ion etching apparatus is preferably based on a plasma source gas that contains nitrogen atoms and fluorine atoms. As one example, nitrogen trifluoride gas can be used. As another example, a mixture of (a) a gas species containing nitrogen atoms and (b) a gas species containing fluorine atoms can be used. For instance, a plasma source gas containing a mixture of a nitrogen gas and one or more carbon-fluorine-series gases may be used. The carbon-fluorine-series gas may be, for example, carbon tetrafluoride, hexafluoroethane, or octafluorocyclobutane.

In some embodiments, the plurality of bottom shallow contacts 411, 413 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The first deposition process may be, for example, chemical vapor deposition, physical vapor deposition, sputtering, atomic layer deposition, or other applicable deposition process.

With reference to FIGS. 10 and 11, the bottom shallow contact at left is referred to as the first bottom shallow contact 411 and has a width W1. The bottom shallow contact at right is referred to as the second bottom shallow contact 413 and has a width W2. In some embodiments, the width W1 of the first bottom shallow contact 411 and the width W2 of the second bottom shallow contact 413 may be substantially the same. In some embodiments, the width W1 of the first bottom shallow contact 411 and the width W2 of the second bottom shallow contact 413 may be different. In some embodiments, the distance D1 between the first bottom shallow contact 411 and the second bottom shallow contact 413 may be greater than the width W1 of the first bottom shallow contact 411 or the width W2 of the second bottom shallow contact 413. In some embodiments, distance D1 between the first bottom shallow contact 411 and the second bottom shallow contact 413 and the width W1 of the first bottom shallow contact 411 (or the width W2 of the second bottom shallow contact 413) may be substantially the same.

With reference to FIG. 12, the middle dielectric layer 213 may be formed on the bottom dielectric layer 211. In some embodiments, the middle dielectric layer 213 may be formed of, for example, silicon oxide, borophosphosilicate glass, undoped silicate glass, fluorinated silicate glass, the like, or a combination thereof. In some embodiments, the undoped silicate glass can be expressed as formula $SiO_x$. The x may be between 1.4 and 2.1. In some embodiments, the middle dielectric layer 213 may be formed by a deposition process such as chemical vapor deposition, plasma enhanced chemical vapor deposition, or other applicable deposition process.

In some embodiments, a planarization process, such as chemical mechanical polishing, may be performed to remove excess material and provide a substantially flat surface for subsequent processing steps.

In some embodiments, the middle dielectric layer 213 may include, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the middle dielectric layer 213 may include a self-planarizing material such as a spin-on glass or a spin-on low-k dielectric material such as SiLK™. The use of a self-planarizing dielectric material may avoid the need to perform a subsequent planarizing step. In some embodiments, the middle dielectric layer 213 may be formed by a deposition process including, for example, chemical vapor deposition, plasma enhanced chemical vapor deposition, spin-on coating, or other applicable deposition process.

With reference to FIG. 12, in some embodiments, the thickness T1 of the bottom dielectric layer 211 and the thickness T2 of the middle dielectric layer 213 may be substantially the same. In some embodiments, the thickness T1 of the bottom dielectric layer 211 and the thickness T2 of the middle dielectric layer 213 may be different.

With reference to FIG. 12, in some embodiments, an opening (not shown) may be formed along the middle dielectric layer 213 to expose the plurality of bottom shallow contacts 411, 413. A conductive material may be subsequently deposited to fill the opening to form the first interconnect layer 611. The opening may be formed by a photolithography process and a subsequent etching process.

In some embodiments, the etching process may be an anisotropic dry etching process using argon and tetrafluoromethane as etchants. The process temperature of the etching process may be between about 120° C. and about 160° C. The process pressure of the etching process may be between about 0.3 Torr and about 0.4 Torr. The process duration of the etching process may be between about 33 and about 39 seconds.

Alternatively, in some embodiments, the etching process may be an anisotropic dry etching process using helium and nitrogen trifluoride as etchants. The process temperature of the etching process may be between about 80° C. and about 100° C. The process pressure of the etching process is between about 1.2 Torr and about 1.3 Torr. The process duration of the etching process may be between about 20 seconds and about 30 seconds.

In some embodiments, a cleaning process may be performed after the formation of the opening. The cleaning process may include applying a mixture of hydrogen and argon as a remote plasma source with a process temperature between about 250° C. and about 350° C. and a process pressure ranging between about 1 Torr and about 10 Torr in the presence of a bias energy applied to the equipment performing the cleaning process. The bias energy may be between about 0 W and 200 W. The cleaning process may remove oxide, originating from oxidation by oxygen in the air, from the top surfaces of the plurality of bottom shallow contacts 411, 413 exposed through the opening without damaging the plurality of bottom shallow contacts 411, 413.

A passivation process may be subsequently performed over the middle dielectric layer 213 and the opening. The passivation process may include soaking the intermediate semiconductor device with a precursor such as dimethylaminotrimethylsilane, tetramethylsilane, or the like at a process temperature between about 200° C. and about 400° C. Ultraviolet radiation may be used to facilitate the passivation process. The passivation process may passivate sidewalls of the middle dielectric layer 213 exposed through the opening by sealing surface pores thereof to reduce undesirable sidewall growth, which may affect the electric characteristics of the semiconductor device 1A, during subsequent processing steps. As a result, the performance and reliability of the semiconductor device 1A may be increased.

In some embodiments, the opening may be sequentially filled with the conductive material by sputtering, electro-plating, or electroless plating. For example, when the opening is filled by sputtering using an aluminum-copper material as source, the process temperature of sputtering may be between about 100° C. and about 400° C. The process pressure of sputtering may be between about 1 mTorr and about 100 mTorr. After sputtering, an etching process may be performed to trim the filled conductive material to form the first interconnect layer 611. The etching process may use chlorine and argon as etchants. The etchant flow of chlorine may be between about 10 sccm (standard cubic centimeters to minute) and about 30 sccm. The etchant flow of argon may be between about 900 sccm and about 1100 sccm. The process temperature of the etching process may be between about 50° C. and about 200° C. The process pressure of the etching process may be between about 50 mTorr and about 10 Torr. The process duration of the etching process may be between about 30 seconds and about 200 seconds. In this example, the first interconnect layer 611 may be formed of aluminum-copper alloy. Small quantities of copper in aluminum may improve the electromigration resistance and further reduce the occurrence of hillocks, which is small protrusions of aluminum on a surface of a thin film layer of aluminum.

For another example, the opening may be filled by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C. In this example, the first interconnect layer 611 may be formed of copper.

In some embodiments, the plating solution may include accelerators, suppressors, or levelers. The accelerators may include a polar sulfur, oxygen, or nitrogen functional group that help to increase deposition rates and may promote dense nucleation. The accelerators may be present at a low concentration level, for example, between about 0 and about 200 ppm. The suppressors are additives that reduce the plating rate and are usually present in the plating bath at higher concentrations, for example, between about 5 ppm and about 1000 ppm. The suppressors may be polymeric surfactants with high molecular weight, such as polyethylene glycol.

The suppressors may slow down the deposition rate by adsorbing on the surface and forming a barrier layer to the copper ions. Because of their large size and low diffusion rate, the suppressors are less likely to reach the lower part of the pad opening. Therefore, most of the suppressing effect may occur at the upper part of the pad opening, helping to reduce overburden of the filling material (e.g., copper) and avoid the opening "closing".

The leveler may be used to improve filling performance, decrease the surface roughness, and prevent copper deposition at the upper part of the opening. The levelers may be present in a small concentration, for example, between about 1 ppm and about 100 ppm. The levelers may be, for example, 3-mercapto-1-propanesulfonate, (3-sulfopropyl) disulfide, or 3,3-thiobis (1-propanesulfonate).

In some embodiments, the first interconnect layer 611 may include a bottom portion (not shown) and a top portion (not shown). The bottom portion may be formed on the lower part of the opening. The top portion may be formed on the bottom portion and completely fill the opening. The bottom portion may include nickel. The top portion may include palladium, cobalt, or a combination thereof.

With reference to FIG. 12, in some embodiments, the width W3 of the first interconnect layer 611 and the width W4 of the word line structure 310 may be substantially the same. In some embodiments, the width W3 of the first interconnect layer 611 and the width W4 of the word line structure 310 may be different. For example, the width W3 of the first interconnect layer 611 may be less than the width W4 of the word line structure 310.

Figure 13:
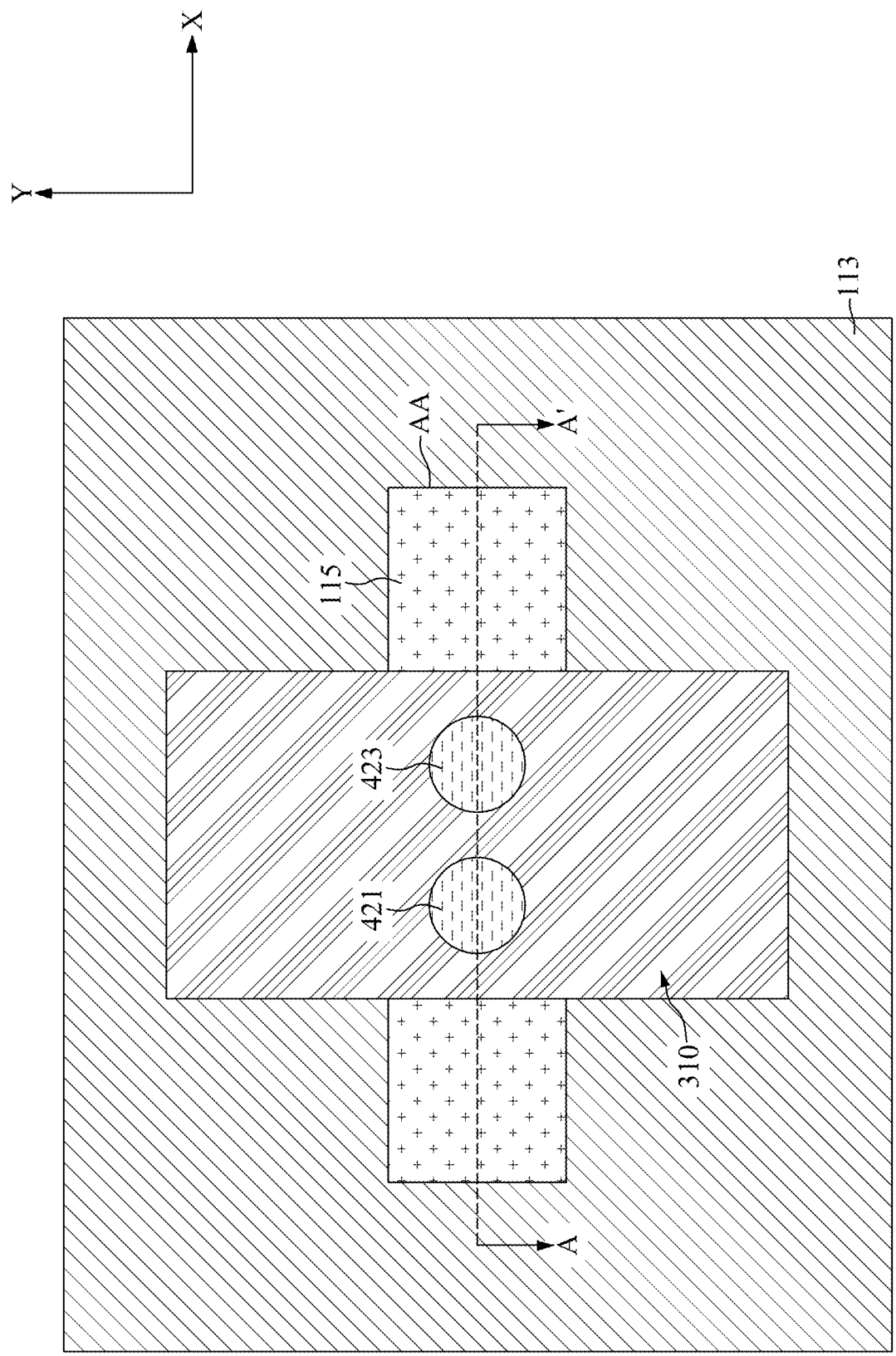
FIG. 13 illustrates, in a schematic top-view diagram, an intermediate semiconductor device in accordance with one embodiment of the present disclosure.
Figure 14:
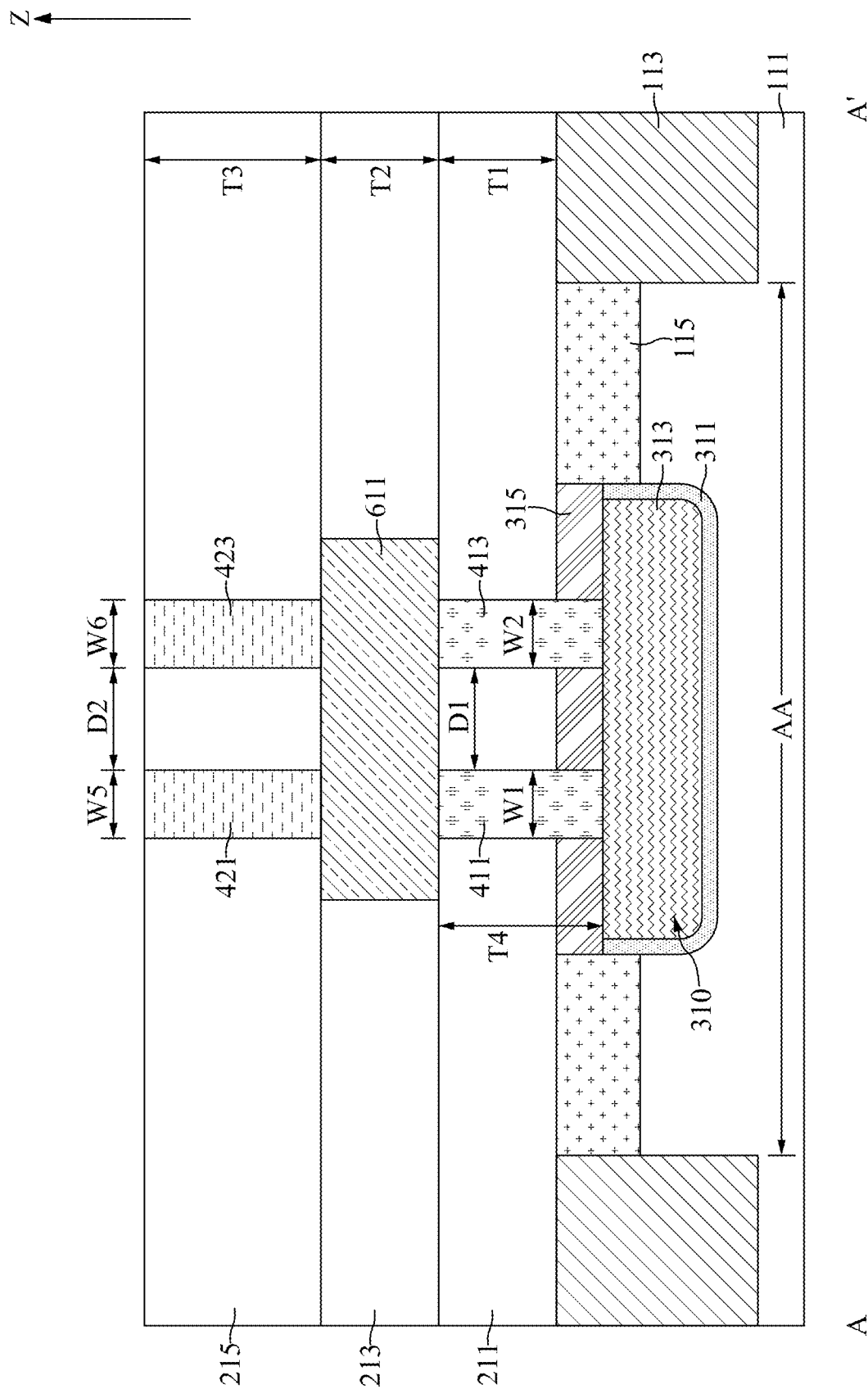
FIG. 14 is a schematic cross-sectional view diagram taken along a line A-A' in FIG. 13 illustrating part of the flow for fabricating the semiconductor device in accordance with one embodiment of the present disclosure.
Figure 15:
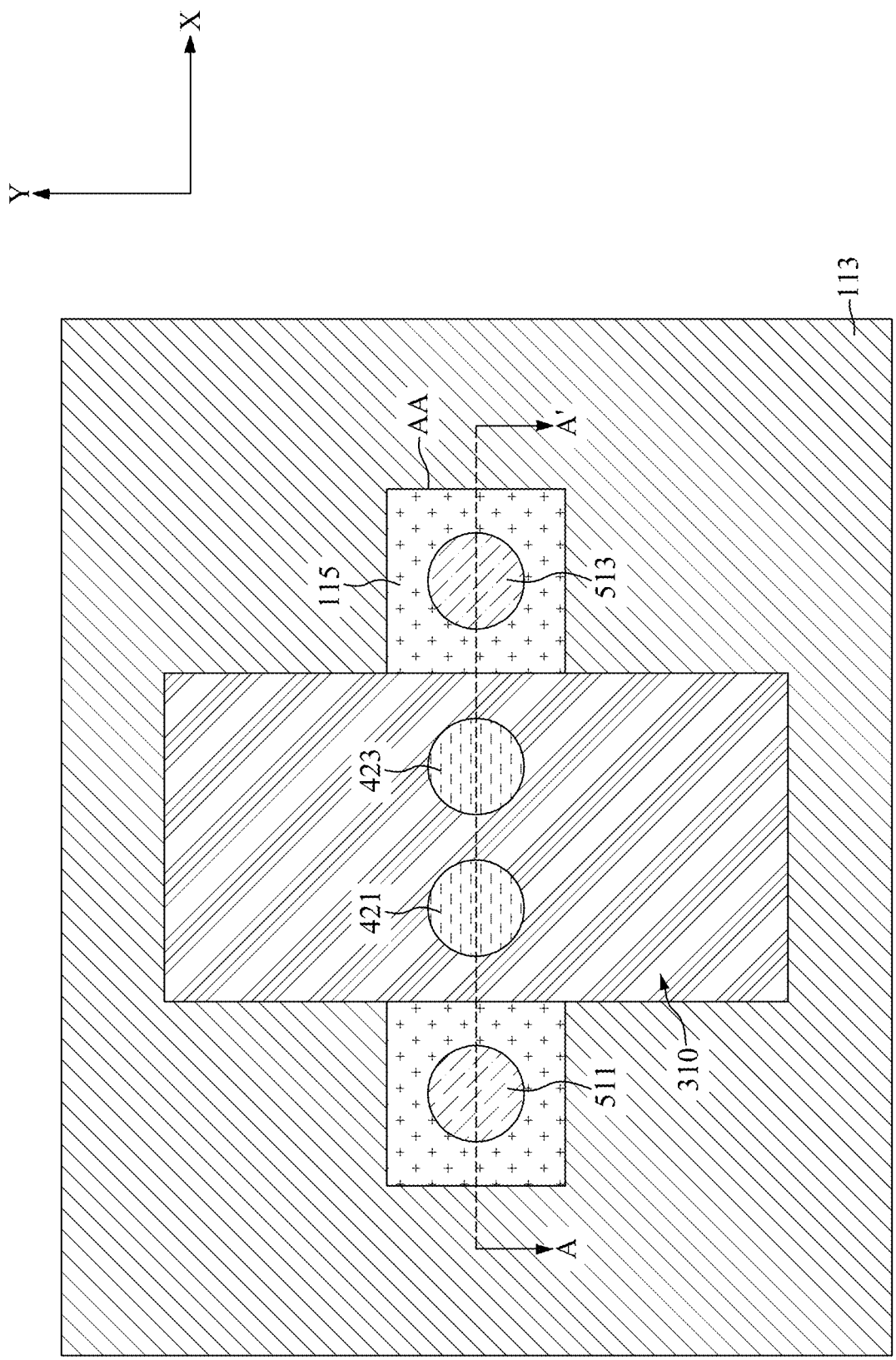
FIG. 15 illustrates, in a schematic top-view diagram, an intermediate semiconductor device in accordance with one embodiment of the present disclosure.
Figure 16:
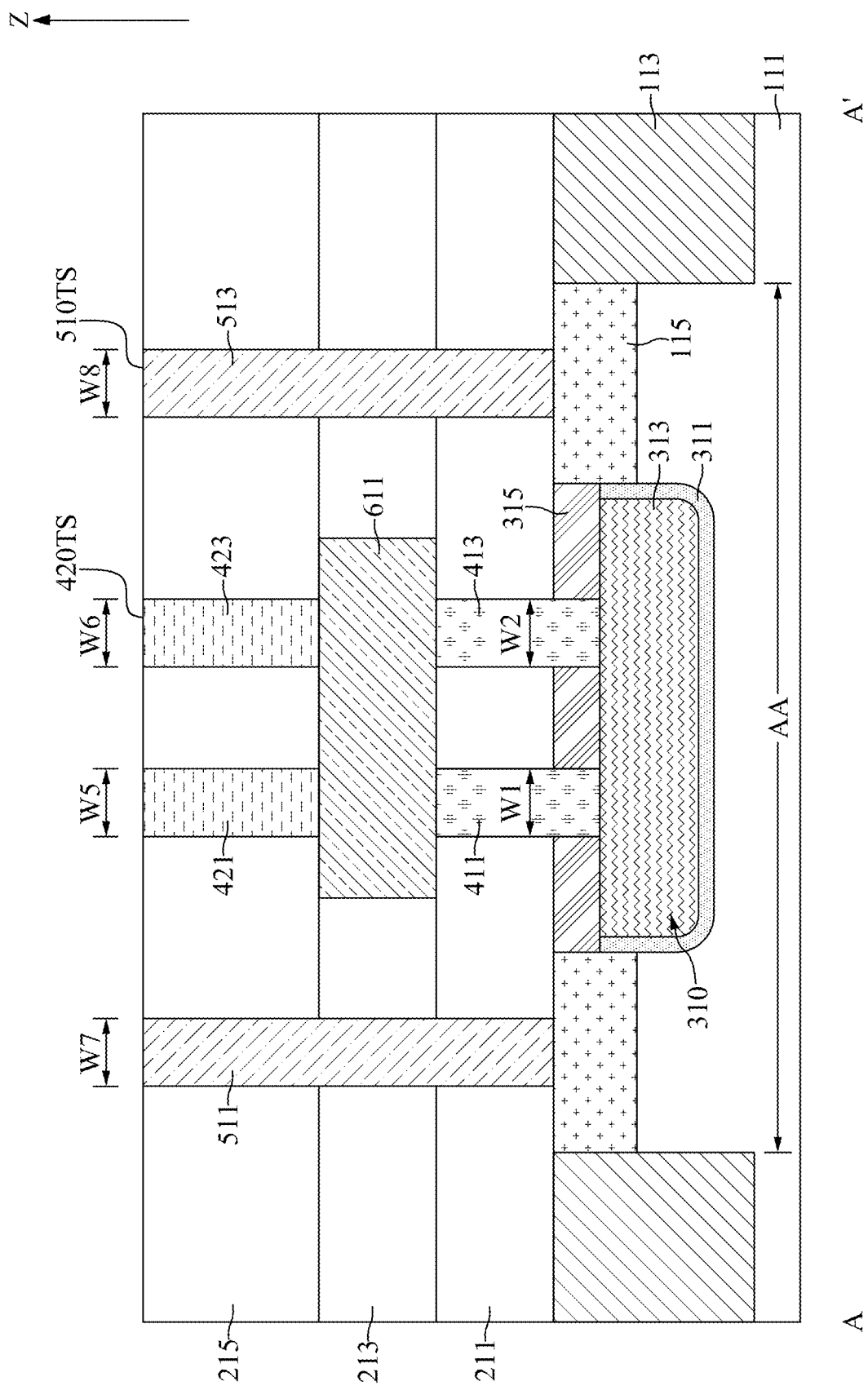
FIGS. 16 and 17 are schematic cross-sectional view diagrams taken along a line A-A' in FIG. 15 illustrating part of the flow for fabricating the semiconductor device in accordance with one embodiment of the present disclosure.
Figure 17:
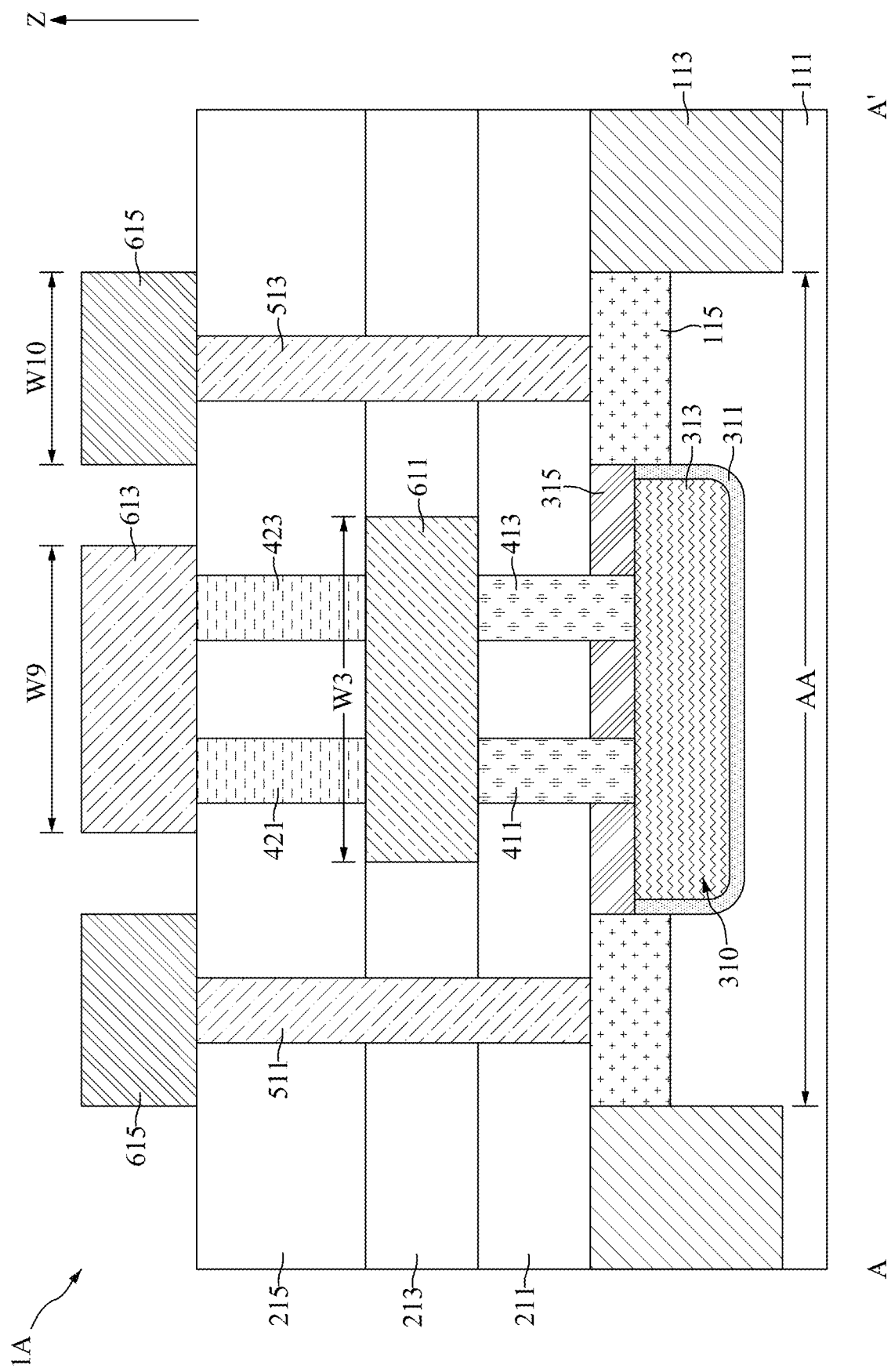

FIG. 13 illustrates, in a schematic top-view diagram, an intermediate semiconductor device in accordance with one embodiment of the present disclosure. FIG. 14 is a schematic cross-sectional view diagram taken along a line A-A' in FIG. 13 illustrating part of the flow for fabricating the semiconductor device 1A in accordance with one embodiment of the present disclosure. FIG. 15 illustrates, in a schematic top-view diagram, an intermediate semiconductor device in accordance with one embodiment of the present disclosure. FIGS. 16 and 17 are schematic cross-sectional view diagrams taken along a line A-A' in FIG. 15 illustrating part of the flow for fabricating the semiconductor device 1A in accordance with one embodiment of the present disclosure.

With reference to FIG. 1 and FIGS. 13 to 16, at step S17, a plurality of top shallow contacts 421, 423 may be formed on the first interconnect layer 611 and a plurality of deep contacts 511, 513 may be formed on the plurality of impurity regions 115.

With reference to FIGS. 13 and 14, the top dielectric layer 215 may be formed on the middle dielectric layer 213. In some embodiments, the top dielectric layer 215 may be formed of, for example, silicon oxide, borophosphosilicate glass, undoped silicate glass, fluorinated silicate glass, the like, or a combination thereof. In some embodiments, the undoped silicate glass can be expressed as formula $SiO_x$. The x may be between 1.4 and 2.1. In some embodiments, the top dielectric layer 215 may be formed by a deposition process such as chemical vapor deposition, plasma enhanced chemical vapor deposition, or other applicable deposition process.

In some embodiments, a planarization process, such as chemical mechanical polishing, may be performed to remove excess material and provide a substantially flat surface for subsequent processing steps.

In some embodiments, the top dielectric layer 215 may include, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the top dielectric layer 215 may include a self-planarizing material such as a spin-on glass or a spin-on low-k dielectric material such as SiLK™. The use of a self-planarizing dielectric material may avoid the need to perform a subsequent planarizing step. In some embodiments, the top dielectric layer 215 may be formed by a deposition process including, for example, chemical vapor deposition, plasma enhanced chemical vapor deposition, spin-on coating, or other applicable deposition process.

With reference to FIGS. 13 and 14, in some embodiments, the thickness T3 of the top dielectric layer 215 may be greater than the thickness T2 of the middle dielectric layer 213 or the thickness T1 of the bottom dielectric layer 211. In some embodiments, the thickness T3 of the top dielectric layer 215 may be substantially the same as the thickness T2 of the middle dielectric layer 213 or the thickness T1 of the bottom dielectric layer 211.

With reference to FIGS. 13 and 14, a plurality of contact openings (not shown) may be formed along the top dielectric layer 215 to expose portions of the first interconnect layer 611. The plurality of contact openings may be formed by a second opening etch process. Subsequently, a second deposition process may be performed to fill the plurality of contact openings. A planarization process, such as chemical mechanical polishing, may be performed until the top surface of the top dielectric layer 215 to remove excess material, provide a substantially flat surface for subsequent processing steps, and form the plurality of top shallow contacts 421, 423.

In some embodiments, the second opening etch process may be conducted in any suitable plasma processing apparatus, for example, a reactive ion etching apparatus. The reactive ion etching apparatus may contain an anode and cathode within a vacuum chamber. The cathode is typically in the form of a pedestal for supporting a semiconductor wafer within the chamber, while the anode is typically formed of the walls and top of the chamber. To process a wafer, a plasma source gas is pumped into the vacuum chamber and the anode and cathode are driven by a single sinusoidal frequency source to excite the plasma source gas into a plasma. The single frequency is typically 13.56 MHz, although frequencies from 100 kHz to 2.45 GHz are often used, with the occasional use of other frequencies. The RF power excites the plasma source gas, producing a plasma within the chamber proximate to the semiconductor wafer being processed. The etching chemistry used in the second opening etch process by the reactive ion etching apparatus is preferably based on a plasma source gas that contains nitrogen atoms and fluorine atoms. As one example, nitrogen trifluoride gas can be used. As another example, a mixture of (a) a gas species containing nitrogen atoms and (b) a gas species containing fluorine atoms can be used. For instance, a plasma source gas containing a mixture of a nitrogen gas and one or more carbon-fluorine-series gases may be used. The carbon-fluorine-series gas may be, for example, carbon tetrafluoride, hexafluoroethane, or octafluorocyclobutane.

In some embodiments, the plurality of top shallow contacts 421, 423 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The second deposition process may be, for example, chemical vapor deposition, physical vapor deposition, sputtering, atomic layer deposition, or other applicable deposition process.

With reference to FIGS. 13 and 14, the top shallow contact at left is referred to as the first top shallow contact 421 and has a width W5. The top shallow contact at right is referred to as the second top shallow contact 423 and has a width W6. In some embodiments, the width W5 of the first top shallow contact 421 and the width W6 of the second top shallow contact 423 may be substantially the same. In some embodiments, the width W5 of the first top shallow contact 421 and the width W6 of the second top shallow contact 423 may be different. In some embodiments, the distance D2 between the first top shallow contact 421 and the second top shallow contact 423 may be greater than the width W5 of the first top shallow contact 421 or the width W6 of the second top shallow contact 423. In some embodiments, distance D2 between the first top shallow contact 421 and the second top shallow contact 423 between the first top shallow contact 421 and the second top shallow contact 423 and the width W5 of the first top shallow contact 421 (or the width W6 of the second top shallow contact 423) may be substantially the same.

With reference to FIGS. 13 and 14, in some embodiments, the widths W5, W6 of the plurality of top shallow contacts 421, 423 and the width W1, W2 of the plurality of bottom shallow contacts 411, 413 may be substantially the same. In some embodiments, the widths W5, W6 of the plurality of top shallow contacts 421, 423 and the width W1, W2 of the plurality of bottom shallow contacts 411, 413 may be different. In some embodiments, the distance D2 between the first top shallow contact 421 and the second top shallow contact 423 and the distance D1 between the first bottom shallow contact 411 and the second bottom shallow contact 413 may be substantially the same. In some embodiments, the distance D2 between the first top shallow contact 421 and the second top shallow contact 423 and the distance D1 between the first bottom shallow contact 411 and the second bottom shallow contact 413 may be different.

With reference to FIGS. 13 and 14, in some embodiments, the first bottom shallow contact 411 and the first top shallow contact 421 may be topographically aligned and the second bottom shallow contact 413 and the second top shallow contact 423 may be topographically aligned. In some embodiments, the first top shallow contact 421 and the first bottom shallow contact 411 may be topographically aligned and the second top shallow contact 423 and the second bottom shallow contact 413 are not topographically aligned. In some embodiments, the first bottom shallow contact 411 and the first top shallow contact 421 are not topographically aligned and the second bottom shallow contact 413 and the second top shallow contact 423 are not topographically aligned.

In the description of the present disclosure, two features are topographically aligned when those features have substantially the same x, y coordinates.

With reference to FIGS. 13 and 14, in some embodiments, the thickness T3 of the plurality of top shallow contacts 421, 423 and the thickness T4 of the plurality of bottom shallow contacts 411, 413 may be different. In some embodiments, the thickness T3 of the plurality of top shallow contacts 421, 423 and the thickness T4 of the plurality of bottom shallow contacts 411, 413 may be substantially the same.

With reference to FIGS. 15 and 16, a plurality of contact openings (not shown) may be formed along the top dielectric layer 215, the middle dielectric layer 213, and the bottom dielectric layer 211 to expose portions of the plurality of impurity regions 115. The plurality of contact openings may be formed by a third opening etch process. Subsequently, a third deposition process may be performed to fill the plurality of contact openings. A planarization process, such as chemical mechanical polishing, may be performed until the top surface of the top dielectric layer 215 to remove excess material, provide a substantially flat surface for subsequent processing steps, and form the plurality of deep contacts 511, 513. In other words, the top surfaces 420TS of the plurality of top shallow contacts 421, 423 and the top surfaces 510TS of the plurality of deep contacts 511, 513 may be substantially coplanar.

In some embodiments, the third opening etch process may be conducted in any suitable plasma processing apparatus, for example, a reactive ion etching apparatus. The reactive ion etching apparatus may contain an anode and cathode within a vacuum chamber. The cathode is typically in the form of a pedestal for supporting a semiconductor wafer within the chamber, while the anode is typically formed of the walls and top of the chamber. To process a wafer, a plasma source gas is pumped into the vacuum chamber and the anode and cathode are driven by a single sinusoidal frequency source to excite the plasma source gas into a plasma. The single frequency is typically 13.56 MHz, although frequencies from 100 kHz to 2.45 GHz are often used, with the occasional use of other frequencies. The RF power excites the plasma source gas, producing a plasma within the chamber proximate to the semiconductor wafer being processed. The etching chemistry used in the third opening etch process by the reactive ion etching apparatus is preferably based on a plasma source gas that contains nitrogen atoms and fluorine atoms. As one example, nitrogen trifluoride gas can be used. As another example, a mixture of (a) a gas species containing nitrogen atoms and (b) a gas species containing fluorine atoms can be used. For instance, a plasma source gas containing a mixture of a nitrogen gas and one or more carbon-fluorine-series gases may be used. The carbon-fluorine-series gas may be, for example, carbon tetrafluoride, hexafluoroethane, or octafluorocyclobutane.

In some embodiments, the plurality of deep contacts 511, 513 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The third deposition process may be, for example, chemical vapor deposition, physical vapor deposition, sputtering, atomic layer deposition, or other applicable deposition process.

With reference to FIGS. 15 and 16, the deep contact at left is referred to as the first deep contact 511 and has a width W7. The deep contact at right is referred to as the second deep contact 513 and has a width W8. In some embodiments, the width W7 of the first deep contact 511 and the width W8 of the second deep contact 513 may be substantially the same. In some embodiments, the width W7 of the first deep contact 511 and the width W8 of the second deep contact 513 may be different.

With reference to FIGS. 15 and 16, in some embodiments, the widths W7, W8 of the plurality of deep contacts 511, 513 and the width W1, W2 of the plurality of bottom shallow contacts 411, 413 may be substantially the same. In some embodiments, the widths W7, W8 of the plurality of deep contacts 511, 513 and the width W1, W2 of the plurality of bottom shallow contacts 411, 413 may be different. For example, the widths W7, W8 of the plurality of deep contacts 511, 513 may be greater than the width W1, W2 of the plurality of bottom shallow contacts 411, 413.

In some embodiments, the widths W7, W8 of the plurality of deep contacts 511, 513 and the widths W5, W6 of the plurality of top shallow contacts 421, 423 may be different. For example, the widths W7, W8 of the plurality of deep contacts 511, 513 may be greater than the widths W5, W6 of the plurality of top shallow contacts 421, 423. In some embodiments, the widths W7, W8 of the plurality of deep contacts 511, 513 and the widths W5, W6 of the plurality of top shallow contacts 421, 423 may be substantially the same.

With reference to FIGS. 1 and 17, at step S19, a second interconnect layer 613 may be formed on the plurality of top shallow contacts 421, 423 and a plurality of third interconnect layers 615 may be formed on the plurality of deep contacts 511, 513.

With reference to FIG. 17, the second interconnect layer 613 and the plurality of third interconnect layers 615 may be formed on the top dielectric layer 215. In some embodiments, the second interconnect layer 613 and the plurality of third interconnect layers 615 may be formed by initially forming a seed layer (not separately shown in FIG. 17). The seed layer may be a thin layer of a conductive material that aids in the formation of a thicker layer during subsequent processing steps. The seed layer may include a layer of titanium about 1,000 Angstroms thick followed by a layer of copper about 5,000 Angstroms thick. The seed layer may be formed using processes such as sputtering, evaporation, or plasma-enhanced chemical vapor deposition, depending upon the desired materials. The seed layer may be formed to have a thickness of between about 0.3 µm and about 1 µm, such as about 0.5 µm.

Once the seed layer has been formed the second interconnect layer 613 and the plurality of third interconnect layers 615 may be formed over the seed layer. In some embodiments, the second interconnect layer 613 and the plurality of third interconnect layers 615 may include one or more conductive materials, such as copper, tungsten, other conductive metals, or the like, and may be formed, for example, by electroplating, electroless plating, or the like. In some embodiments, a photoresist (not separately shown in FIG. 17) may be placed on the seed layer and patterned to expose the seed layer where the second interconnect layer 613 and the plurality of third interconnect layers 615 are desired to be formed.

Once patterned, an electroplating process may be used wherein the seed layer and the photoresist are submerged or immersed in the electroplating solution. The seed layer surface may be electrically connected to the negative side of an external DC power supply such that the seed layer functions as the cathode in the electroplating process. A solid conductive anode, such as a copper anode, may be also immersed in the solution and may be attached to the positive side of the power supply. The atoms from the anode are dissolved into the solution, from which the cathode (e.g., the seed layer) acquires the dissolved atoms, thereby plating the exposed conductive areas of the seed layer within the opening of the photoresist. After the second interconnect layer 613 and the plurality of third interconnect layers 615 are formed, the photoresist may be removed.

With reference to FIG. 17, the width W9 of the second interconnect layer 613 and the width W3 of the first interconnect layer 611 may be different. For example, the width W9 of the second interconnect layer 613 may be less than the width W3 of the first interconnect layer 611. In some embodiments, the width W9 of the second interconnect layer 613 and the width W3 of the first interconnect layer 611 may be substantially the same.

With reference to FIG. 17, the width W9 of the second interconnect layer 613 may be greater than the widths W10 of the plurality of third interconnect layers 615. In some embodiments, the width W9 of the second interconnect layer 613 and the widths W10 of the plurality of third interconnect layers 615 may be substantially the same.

Conventionally, the shallow contact may have greater aspect ratio compared to the deep contact due to smaller width. Therefore, directly fabricating a shallow contact which is disposed along the dielectric layers and electrically connected to a word line structure is difficult.

In contrast, by employing the first interconnect layer 611 between the plurality of bottom shallow contacts 411, 413 and the plurality of top shallow contacts 421, 423, the aspect ratio of the plurality of bottom shallow contacts 411, 413 and the plurality of bottom shallow contacts 411, 413 may be reduced. As a result, the complexity of fabricating the semiconductor device 1A may be reduced.

Figure 18:
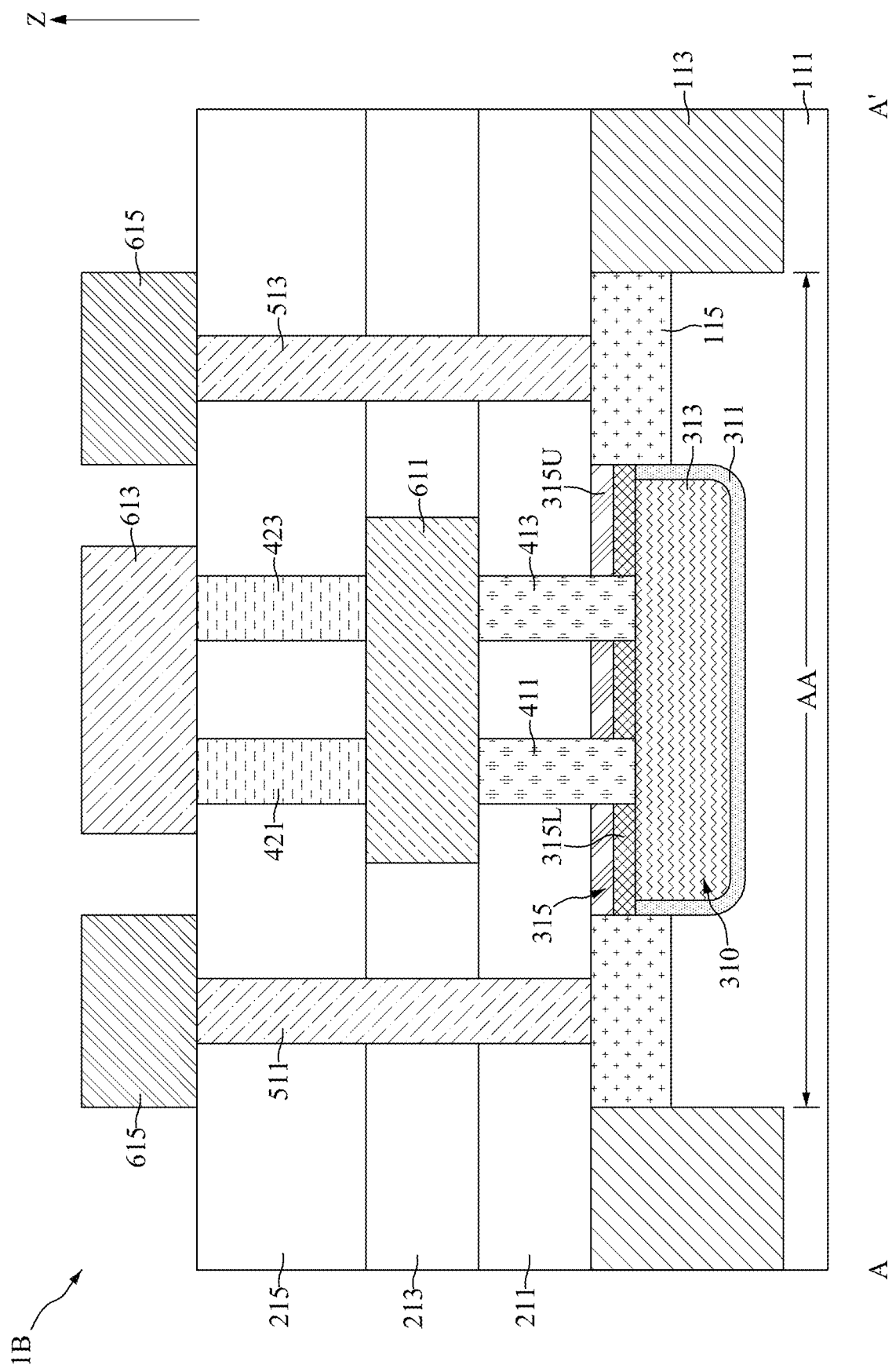
FIG. 18 illustrates, in a schematic cross-sectional view diagram, a semiconductor device in accordance with another embodiment of the present disclosure.

FIG. 18 illustrates, in a schematic cross-sectional view diagram, a semiconductor device 1B in accordance with another embodiment of the present disclosure.

With reference to FIG. 18, the semiconductor device 1B may have a structure similar to that illustrated in FIG. 17. The same or similar elements in FIG. 18 as in FIG. 17 have been marked with similar reference numbers and duplicative descriptions have been omitted.

The word line capping layer 315 may be formed of a stacked layer including a lower portion 315L and an upper portion 315U. The lower portion 315L may be disposed on the word line conductive layer 313. The upper portion 315U may be disposed on the lower portion 315L. The lower portion 315L may be formed of an insulating material having a dielectric constant of about 4.0 or greater. The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. The upper portion 315U may be formed of a low dielectric-constant material such as silicon oxide, silicon nitride, silicon oxynitride, silicon nitride oxide, fluoride-doped silicate, or the like. The upper portion 315U formed of the low dielectric-constant material may reduce electric field at the top surface of the substrate 111; therefore, leakage current may be reduced.

Figure 19:
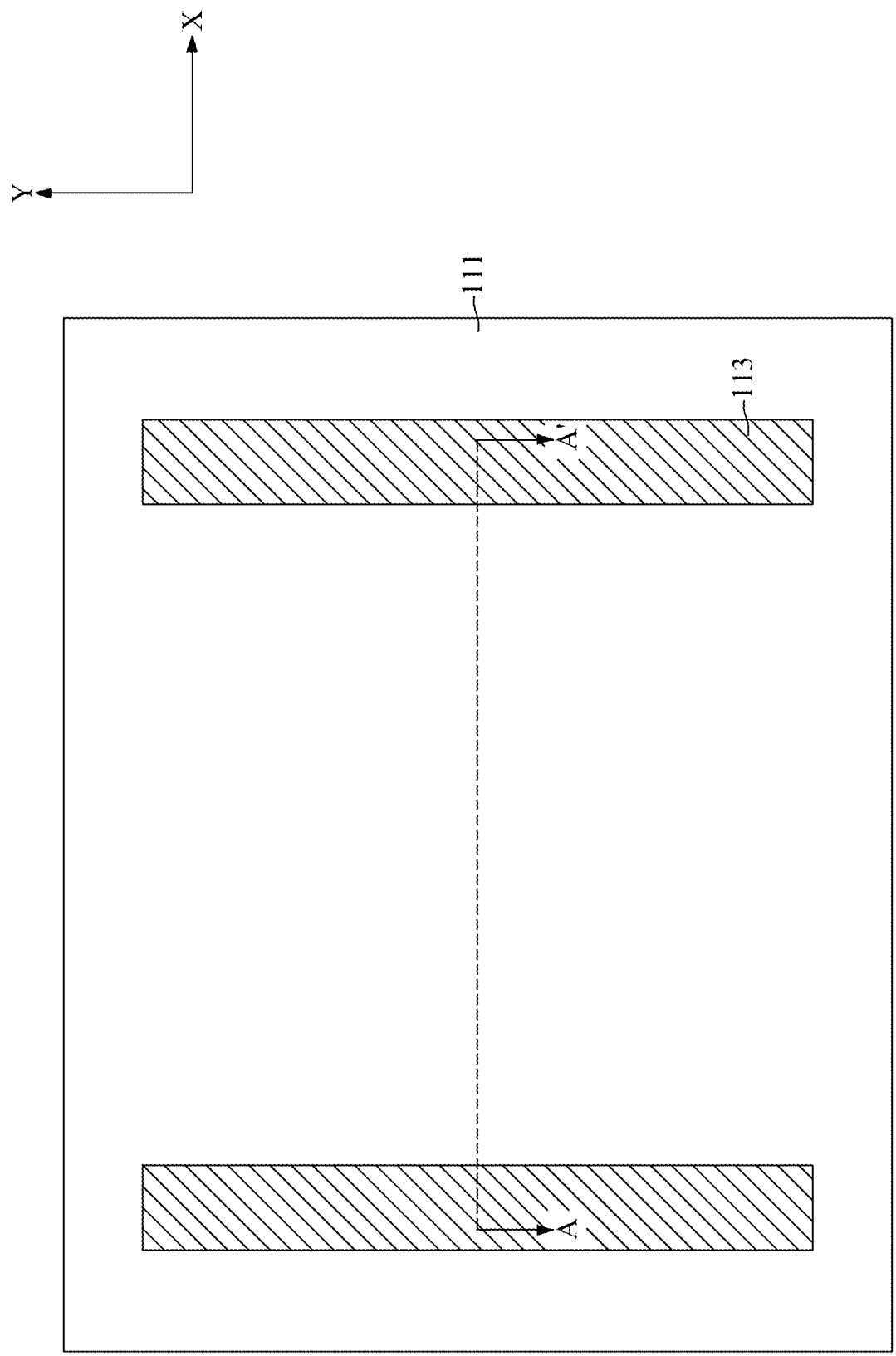
FIG. 19 illustrates, in a schematic top-view diagram, an intermediate semiconductor device in accordance with another embodiment of the present disclosure.
Figure 20:
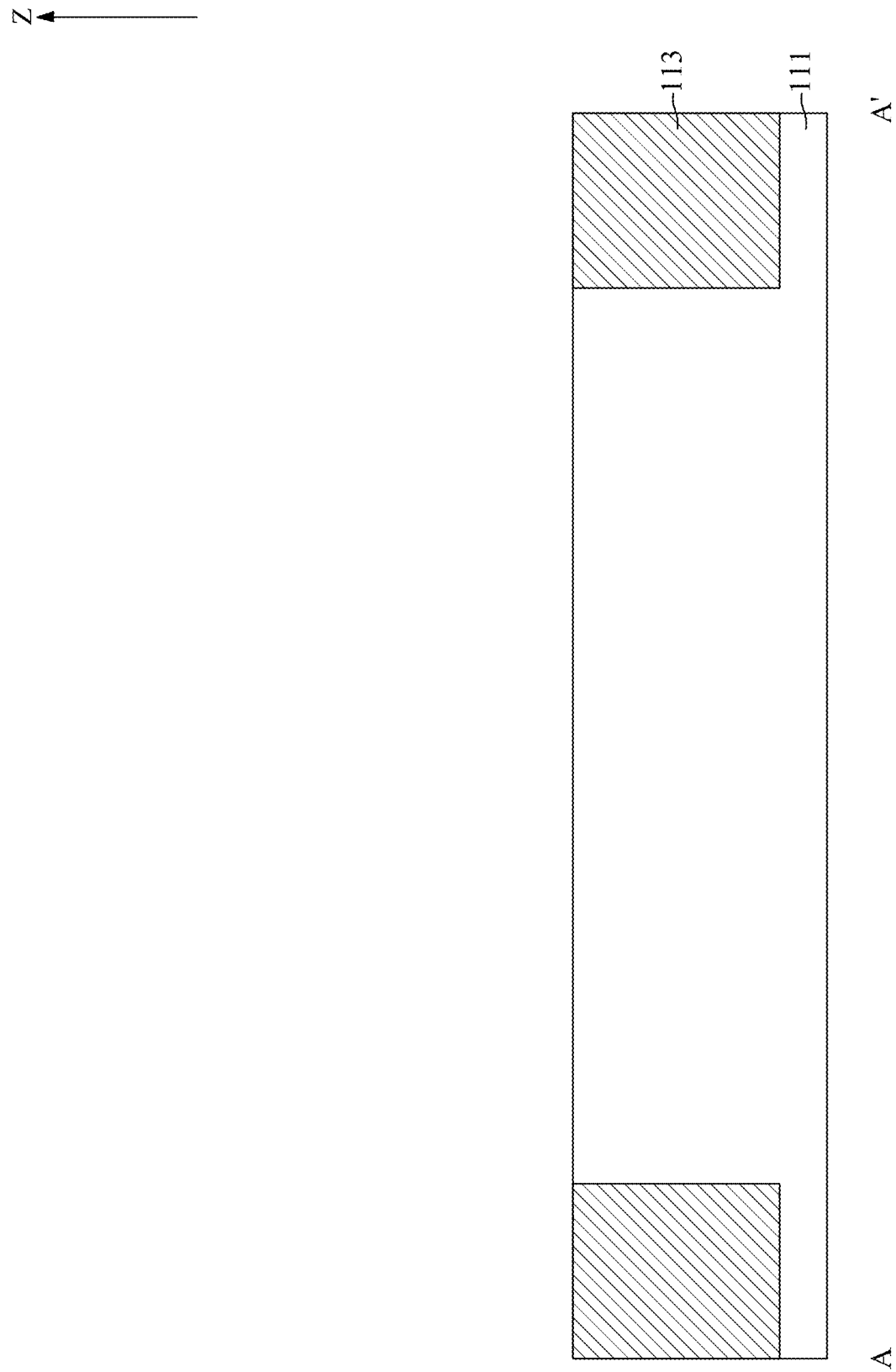
FIG. 20 is a schematic cross-sectional view diagram taken along a line A-A' in FIG. 19 illustrating part of a flow for fabricating a semiconductor device in accordance with another embodiment of the present disclosure.
Figure 21:
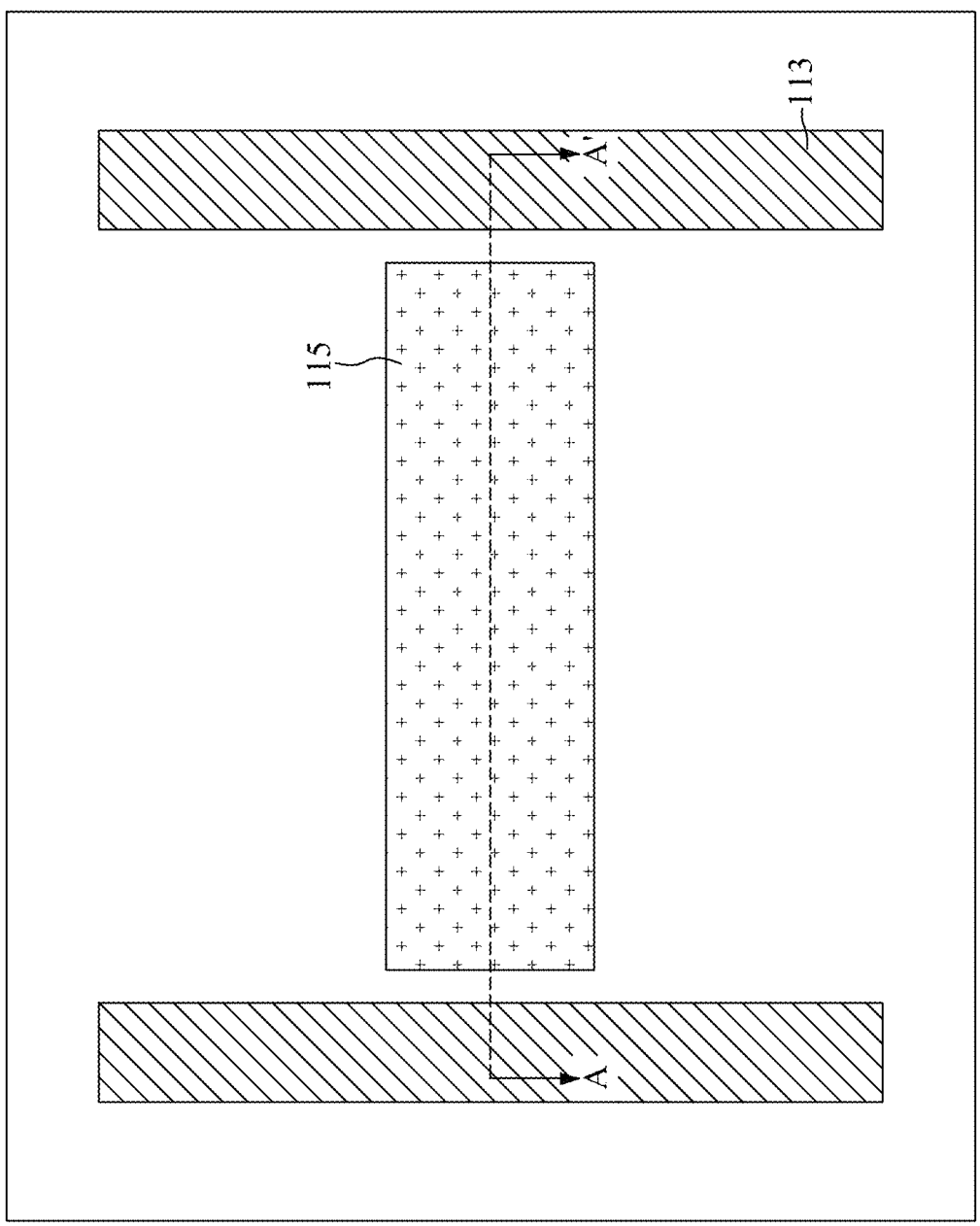
FIG. 21 illustrates, in a schematic top-view diagram, an intermediate semiconductor device in accordance with another embodiment of the present disclosure.
Figure 22:
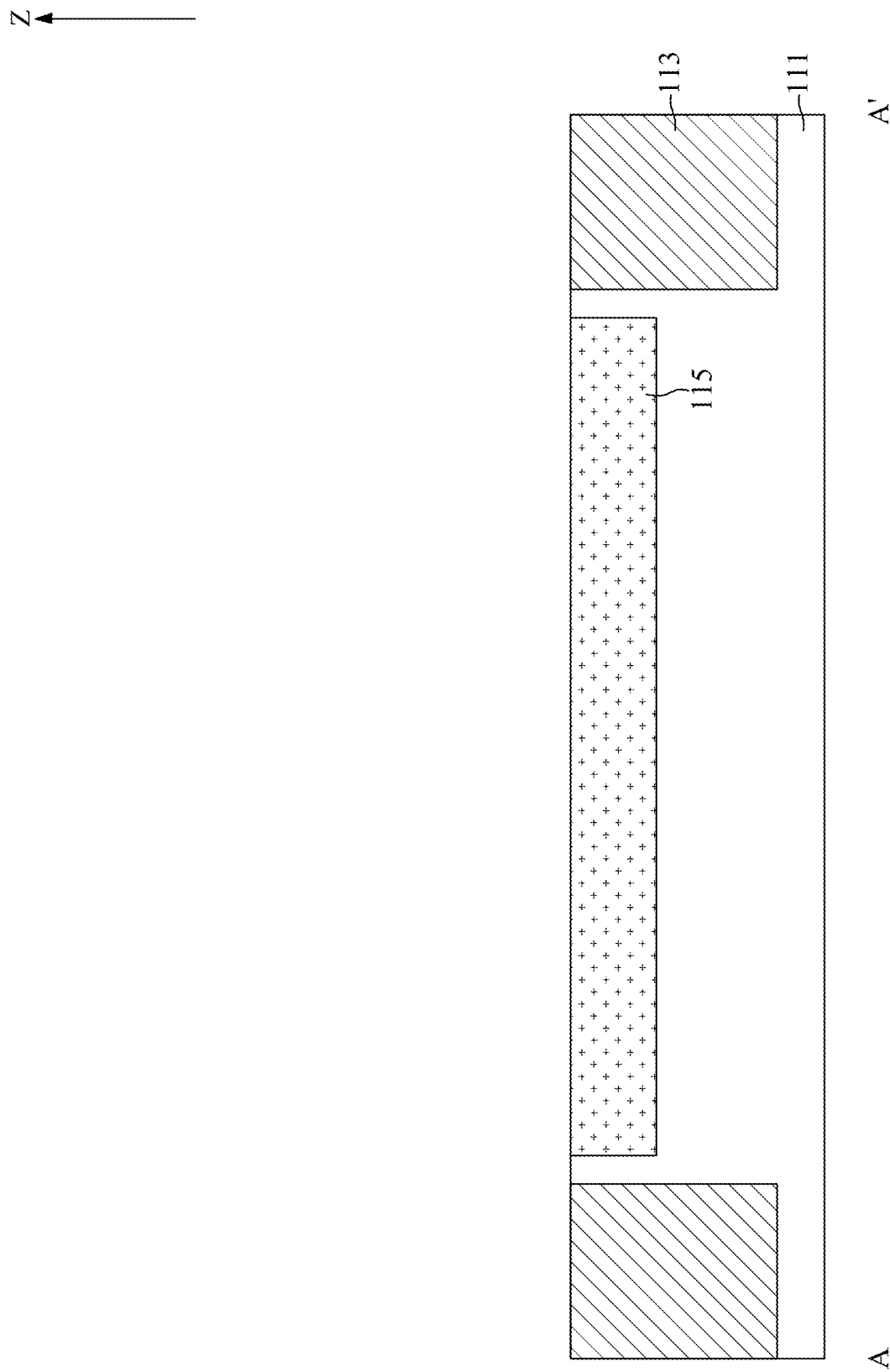
FIG. 22 is a schematic cross-sectional view diagram taken along a line A-A' in FIG. 21 illustrating part of the flow for fabricating the semiconductor device in accordance with another embodiment of the present disclosure.

FIG. 19 illustrates, in a schematic top-view diagram, an intermediate semiconductor device in accordance with another embodiment of the present disclosure. FIG. 20 is a schematic cross-sectional view diagram taken along a line A-A' in FIG. 19 illustrating part of a flow for fabricating a semiconductor device 1C in accordance with another embodiment of the present disclosure. FIG. 21 illustrates, in a schematic top-view diagram, an intermediate semiconductor device in accordance with another embodiment of the present disclosure. FIG. 22 is a schematic cross-sectional view diagram taken along a line A-A' in FIG. 21 illustrating part of the flow for fabricating the semiconductor device 1C in accordance with another embodiment of the present disclosure.

With reference to FIGS. 19 and 20, the substrate 111 may be provided with a procedure similar to that illustrated in FIGS. 2 and 3, and descriptions thereof are not repeated herein. A plurality of isolation layers 113 may be formed in the substrate 111. In a top-view perspective, each of the plurality of isolation layers 113 may have a line shape and may extend along the direction Y. The plurality of isolation layers 113 may be parallel to each other. The plurality of isolation layers 113 may be formed with a procedure similar to that illustrated in FIGS. 2 and 3, and descriptions thereof are not repeated herein.

With reference to FIGS. 21 and 22, the impurity region 115 may be formed in the substrate 111 and between the plurality of isolation layers 113. It should be noted that the impurity region 115 and the plurality of isolation layers 113 are not adjacent. The impurity region 115 may be formed by an implantation process with a mask layer (not shown). The implantation process may be performed with a procedure similar to that illustrated in FIGS. 4 and 5, and descriptions thereof are not repeated herein.

Figure 23:
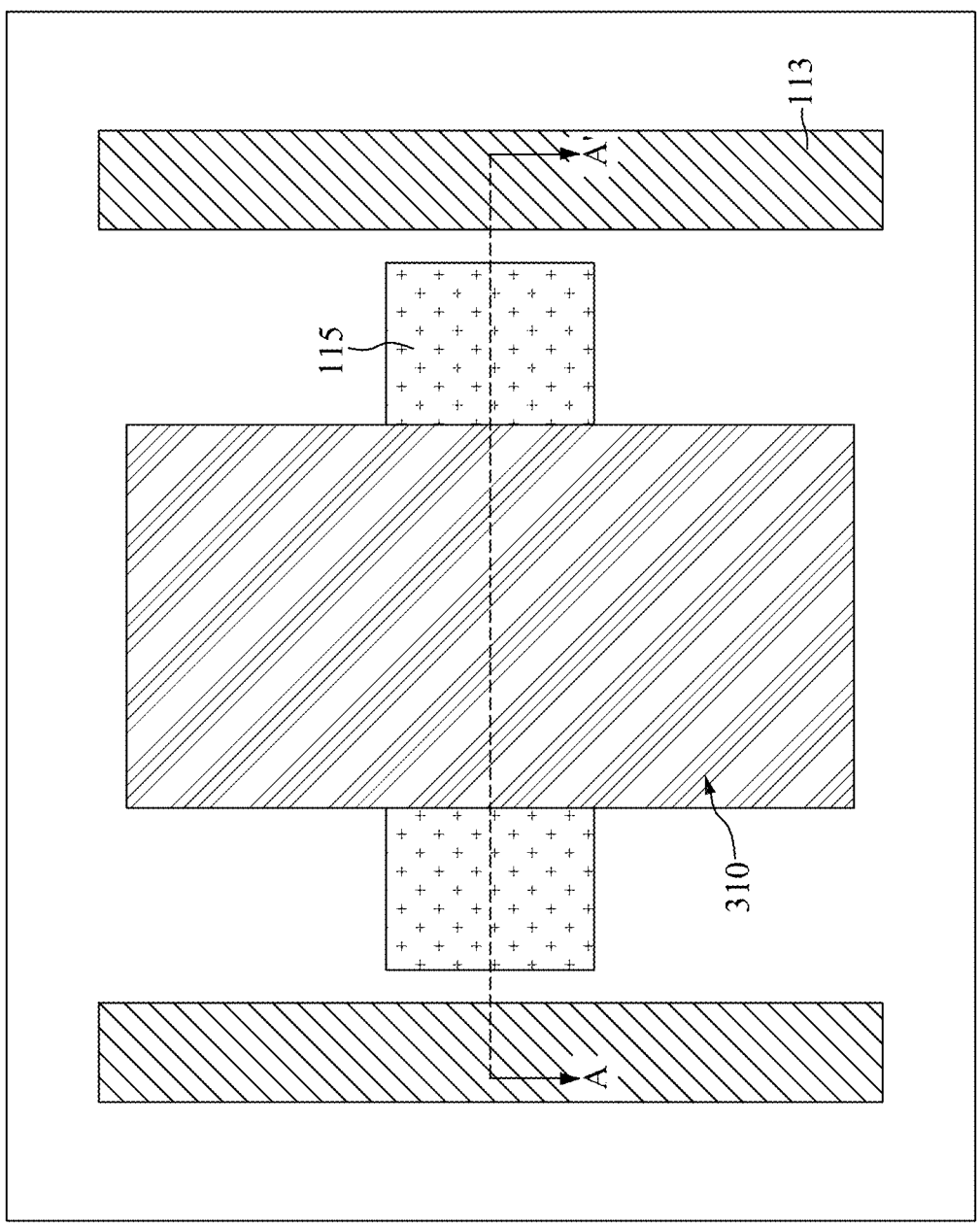
FIG. 23 illustrates, in a schematic top-view diagram, an intermediate semiconductor device in accordance with another embodiment of the present disclosure.
Figure 24:
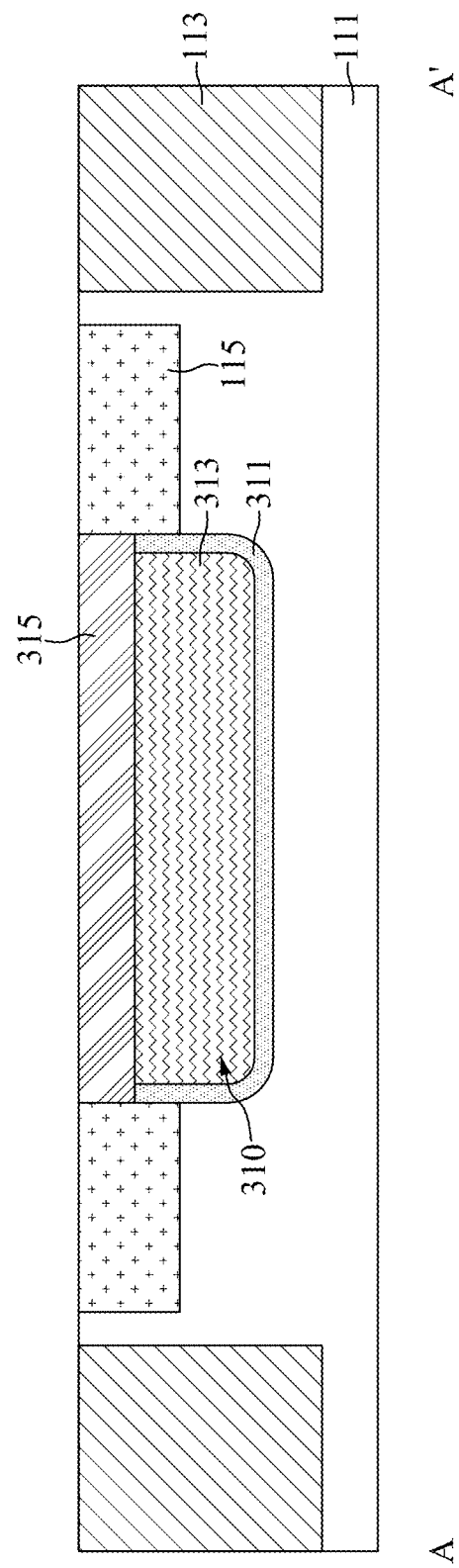
FIG. 24 is a schematic cross-sectional view diagram taken along a line A-A' in FIG. 23 illustrating part of the flow for fabricating the semiconductor device in accordance with another embodiment of the present disclosure.
Figure 25:
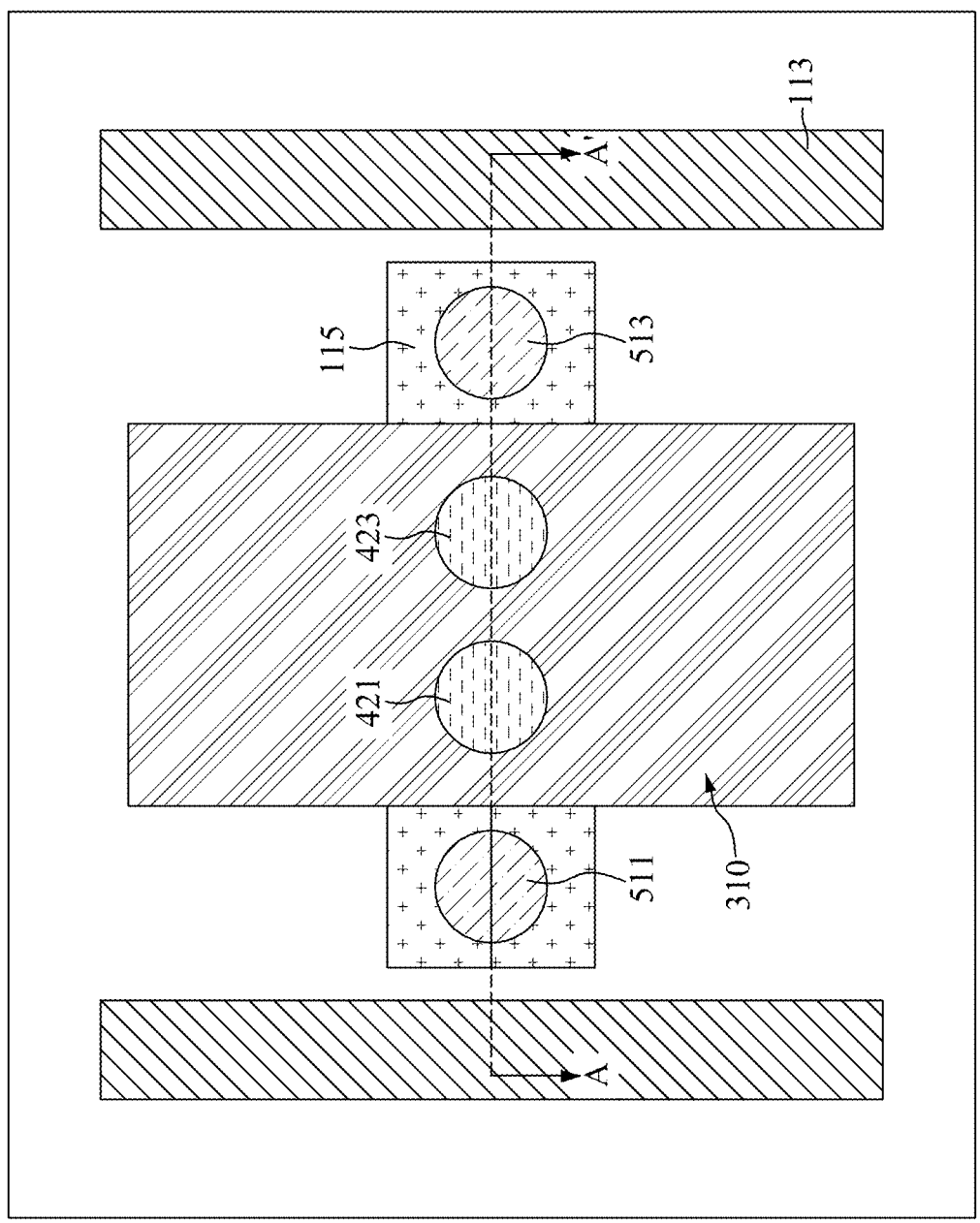
FIG. 25 illustrates, in a schematic top-view diagram, an intermediate semiconductor device in accordance with another embodiment of the present disclosure.
Figure 26:
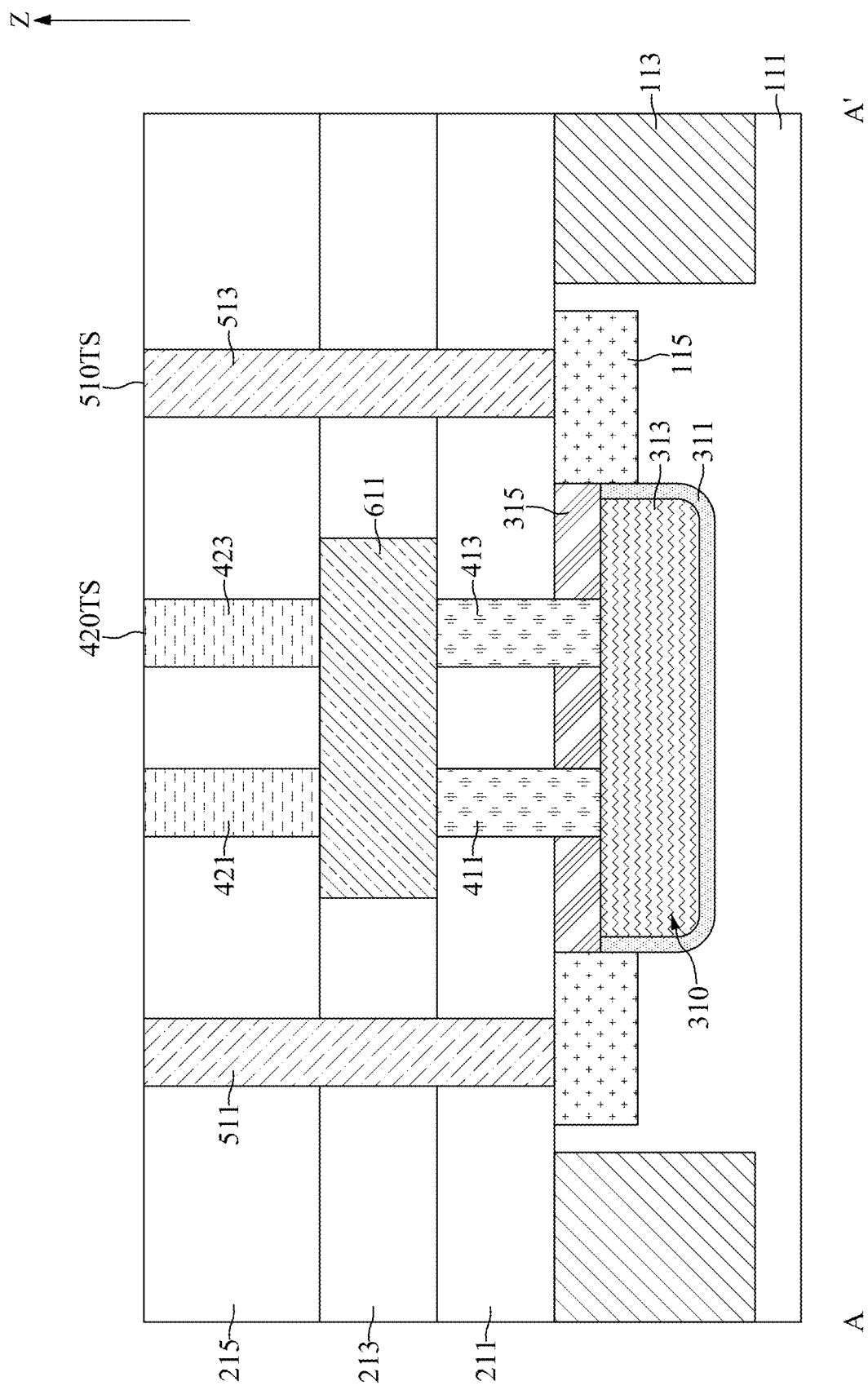
FIGS. 26 and 27 are schematic cross-sectional view diagrams taken along a line A-A' in FIG. 25 illustrating part of the flow for fabricating the semiconductor device in accordance with another embodiment of the present disclosure.
Figure 27:
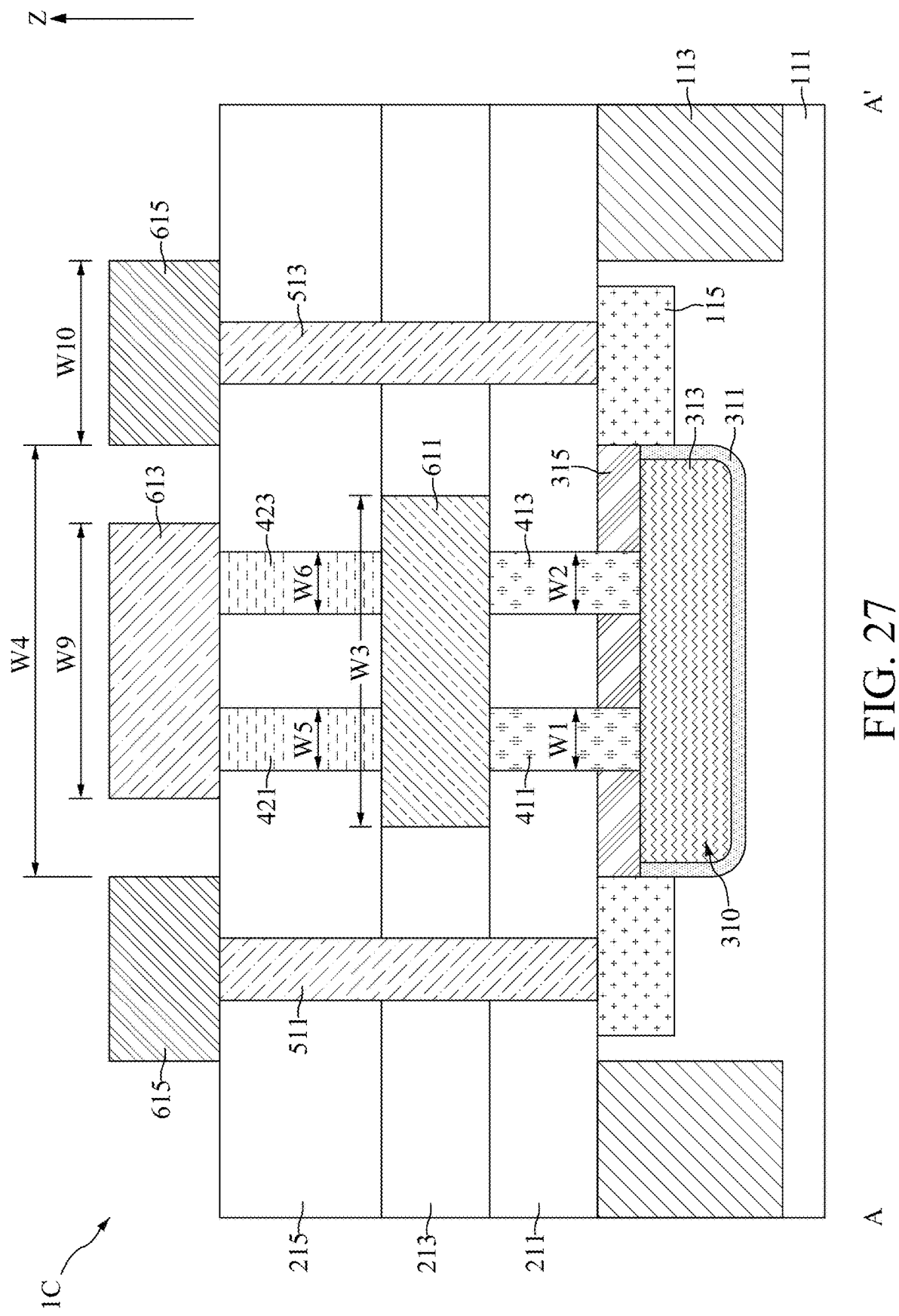

FIG. 23 illustrates, in a schematic top-view diagram, an intermediate semiconductor device in accordance with another embodiment of the present disclosure. FIG. 24 is a schematic cross-sectional view diagram taken along a line A-A' in FIG. 23 illustrating part of the flow for fabricating the semiconductor device 1C in accordance with another embodiment of the present disclosure. FIG. 25 illustrates, in a schematic top-view diagram, an intermediate semiconductor device in accordance with another embodiment of the present disclosure. FIGS. 26 and 27 are schematic cross-sectional view diagrams taken along a line A-A' in FIG. 25 illustrating part of the flow for fabricating the semiconductor device 1C in accordance with another embodiment of the present disclosure.

With reference to FIGS. 23 and 24, the word line structure 310 may be formed with a procedure similar to that illustrated in FIGS. 6 to 9, and descriptions thereof are not repeated herein. The word line structure 310 may extend along the direction Y and parallel to the plurality of isolation layers 113 in a top-view perspective.

With reference to FIGS. 26 to 27, the bottom dielectric layer 211, the middle dielectric layer 213, the top dielectric layer 215, the plurality of bottom shallow contacts 411, 413, the plurality of top shallow contacts 421, 423, the first interconnect layer 611, the second interconnect layer 613, and the plurality of third interconnect layers 615 may be with a procedure similar to that illustrated in FIGS. 10 to 17, and descriptions thereof are not repeated herein.

One aspect of the present disclosure provides a semiconductor device including a substrate; a word line structure positioned in the substrate; a plurality of impurity regions positioned in the substrate and adjacent to the word line structure; a plurality of bottom shallow contacts positioned on the word line structure; a first interconnect layer positioned on the plurality of bottom shallow contacts; a plurality of top shallow contacts positioned on the first interconnect layer; and a plurality of deep contacts positioned on the plurality of impurity regions. Top surfaces of the plurality of top shallow contacts and top surfaces of the plurality of deep contacts are substantially coplanar.

Another aspect of the present disclosure provides a semiconductor device including a substrate; a plurality of isolation layers positioned in the substrate; a word line structure positioned in the substrate and between the plurality of isolation layers; a plurality of impurity regions positioned in the substrate and adjacent to the word line structure; a plurality of bottom shallow contacts positioned on the word line structure; a first interconnect layer positioned on the plurality of bottom shallow contacts; a plurality of top shallow contacts positioned on the first interconnect layer; and a plurality of deep contacts positioned on the plurality of impurity regions. Top surfaces of the plurality of top shallow contacts and top surfaces of the plurality of deep contacts are substantially coplanar. The word line structure extends along a first direction in a top-view perspective. The plurality of isolation layers extend along the first direction and are parallel to each other.

Another aspect of the present disclosure provides a method for fabricating a semiconductor device including providing a substrate; forming a word line structure in the substrate and forming a plurality of impurity regions in the substrate and adjacent to the word line structure; forming a plurality of bottom shallow contacts on the word line structure; forming a first interconnect layer on the plurality of bottom shallow contacts; forming a plurality of top shallow contacts on the first interconnect layer; and forming a plurality of deep contacts on the plurality of impurity regions. Top surfaces of the plurality of top shallow contacts and top surfaces of the plurality of deep contacts are substantially coplanar. Widths of the plurality of bottom shallow contacts are less than widths of the plurality of deep contacts.

Due to the design of the semiconductor device of the present disclosure, the aspect ratio of the plurality of bottom shallow contacts 411, 413 and the plurality of bottom shallow contacts 411, 413 may be reduced by employing the first interconnect layer 611 between the plurality of bottom shallow contacts 411, 413 and the plurality of top shallow contacts 421, 423. As a result, the complexity of fabricating the semiconductor device 1A may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a substrate;
   a word line structure positioned in the substrate;
   a plurality of impurity regions positioned in the substrate and adjacent to the word line structure;
   a plurality of bottom shallow contacts positioned on the word line structure;
   a first interconnect layer positioned on the plurality of bottom shallow contacts;
   a plurality of top shallow contacts positioned on the first interconnect layer; and
   a plurality of deep contacts positioned on the plurality of impurity regions;
   wherein top surfaces of the plurality of top shallow contacts and top surfaces of the plurality of deep contacts are substantially coplanar.

2. The semiconductor device of claim 1, wherein widths of the plurality of bottom shallow contacts are less than widths of the plurality of deep contacts.

3. The semiconductor device of claim 2, wherein the word line structure comprises:
   a word line insulating layer inwardly positioned in the substrate and comprising a U-shaped cross-sectional profile;
   a word line conductive layer positioned on the word line insulating layer; and
   a word line capping layer positioned on the word line insulating layer and the word line conductive layer;
   wherein the plurality of bottom shallow contacts are positioned along the word line capping layer and positioned on the word line conductive layer.

4. The semiconductor device of claim 3, wherein a width of the word line structure and a width of the first interconnect layer are different.

5. The semiconductor device of claim 3, wherein a width of the word line structure and a width of the first interconnect layer are substantially the same.

6. The semiconductor device of claim 4, wherein the widths of the plurality of bottom shallow contacts and widths of the plurality of top shallow contacts are substantially the same.

7. The semiconductor device of claim 4, wherein the widths of the plurality of bottom shallow contacts and widths of the plurality of top shallow contacts are different.

8. The semiconductor device of claim 4, wherein the widths of the plurality of bottom shallow contacts are substantially the same.

9. The semiconductor device of claim 4, wherein the widths of the plurality of bottom shallow contacts are different.

10. The semiconductor device of claim 4, wherein widths of the plurality of top shallow contacts are substantially the same.

11. The semiconductor device of claim 4, widths of the plurality of top shallow contacts are different.

12. The semiconductor device of claim 4, wherein the widths of the plurality of deep contacts are different.

13. The semiconductor device of claim 4, wherein the widths of the plurality of deep contacts are substantially the same.

14. The semiconductor device of claim 4, further comprising a bottom dielectric layer positioned on the substrate, a middle dielectric layer positioned on the bottom dielectric layer, and a top dielectric layer positioned on the middle dielectric layer;
wherein the plurality of bottom shallow contacts are positioned along the bottom dielectric layer;
wherein the first interconnect layer is positioned along the middle dielectric layer and on the plurality of bottom shallow contacts;
wherein the plurality of top shallow contacts are positioned along the top dielectric layer and on the first interconnect layer.

15. The semiconductor device of claim 14, further comprising a second interconnect layer positioned on the plurality of top shallow contacts, and a plurality of third interconnect layers positioned on the plurality of deep contacts, wherein the width of the first interconnect layer and a width of the second interconnect layer are different or substantially the same.

16. A semiconductor device, comprising:
a substrate;
a plurality of isolation layers positioned in the substrate;
a word line structure positioned in the substrate and between the plurality of isolation layers;
a plurality of impurity regions positioned in the substrate and adjacent to the word line structure;
a plurality of bottom shallow contacts positioned on the word line structure;
a first interconnect layer positioned on the plurality of bottom shallow contacts;
a plurality of top shallow contacts positioned on the first interconnect layer; and
a plurality of deep contacts positioned on the plurality of impurity regions;
wherein top surfaces of the plurality of top shallow contacts and top surfaces of the plurality of deep contacts are substantially coplanar;
wherein the word line structure extends along a first direction in a top-view perspective;
wherein the plurality of isolation layers extend along the first direction and are parallel to each other.

17. The semiconductor device of claim 16, widths of the plurality of bottom shallow contacts are less than widths of the plurality of deep contacts, wherein the word line structure comprises:
a word line insulating layer inwardly positioned in the substrate and comprising a U-shaped cross-sectional profile;
a word line conductive layer positioned on the word line insulating layer; and
a word line capping layer positioned on the word line insulating layer and the word line conductive layer;
wherein the plurality of bottom shallow contacts are positioned along the word line capping layer and positioned on the word line conductive layer.

18. The semiconductor device of claim 17, wherein a width of the word line structure and a width of the first interconnect layer are different.

19. The semiconductor device of claim 17, further comprising a bottom dielectric layer positioned on the substrate, a middle dielectric layer positioned on the bottom dielectric layer, a top dielectric layer positioned on the middle dielectric layer, a second interconnect layer positioned on the plurality of top shallow contacts, and a plurality of third interconnect layers positioned on the plurality of deep contacts;
wherein the plurality of bottom shallow contacts are positioned along the bottom dielectric layer;
wherein the first interconnect layer is positioned along the middle dielectric layer and on the plurality of bottom shallow contacts;
wherein the plurality of top shallow contacts are positioned along the top dielectric layer and on the first interconnect layer.

20. A method for fabricating a semiconductor device, comprising:
providing a substrate;
forming a word line structure in the substrate and forming a plurality of impurity regions in the substrate and adjacent to the word line structure;
forming a plurality of bottom shallow contacts on the word line structure;
forming a first interconnect layer on the plurality of bottom shallow contacts;
forming a plurality of top shallow contacts on the first interconnect layer; and
forming a plurality of deep contacts on the plurality of impurity regions;
wherein top surfaces of the plurality of top shallow contacts and top surfaces of the plurality of deep contacts are substantially coplanar;
wherein widths of the plurality of bottom shallow contacts are less than widths of the plurality of deep contacts.

* * * * *